US012622151B2

(12) United States Patent
Lee et al.

(10) Patent No.: US 12,622,151 B2
(45) Date of Patent: May 5, 2026

(54) LIGHT EMITTING DISPLAY DEVICE AND ELECTRONIC DEVICE HAVING THE SAME

(71) Applicant: Samsung Display Co., LTD., Yongin-si (KR)

(72) Inventors: Jun Hee Lee, Yongin-si (KR); Choong Youl Im, Yongin-si (KR); Ha Seok Jeon, Yongin-si (KR); Hyun Duck Cho, Yongin-si (KR); Beohm Rock Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 529 days.

(21) Appl. No.: 18/105,392

(22) Filed: Feb. 3, 2023

(65) Prior Publication Data

US 2023/0363231 A1 Nov. 9, 2023

(30) Foreign Application Priority Data

May 9, 2022 (KR) ........................ 10-2022-0056856

(51) Int. Cl.
*H10K 59/38* (2023.01)
*H10K 59/121* (2023.01)
*H10K 59/122* (2023.01)

(52) U.S. Cl.
CPC ......... *H10K 59/38* (2023.02); *H10K 59/1213* (2023.02); *H10K 59/1216* (2023.02);
(Continued)

(58) Field of Classification Search
CPC ............... H10K 59/38; H10K 59/1213; H10K 59/1216; H10K 59/122; H10K 59/131;
(Continued)

(56) References Cited

U.S. PATENT DOCUMENTS

2011/0012816 A1 1/2011 Kang et al.
2021/0191552 A1 6/2021 Bok et al.
(Continued)

FOREIGN PATENT DOCUMENTS

CN 113544762 10/2021
KR 10-0670047 1/2007
(Continued)

OTHER PUBLICATIONS

Extended European Search Report for European Application No. 23172335.4, dated Jul. 3, 2023.
European Office Action for European Patent Application No. 23 172 335.4, dated Sep. 18, 2024.

*Primary Examiner* — Steven B Gauthier
*Assistant Examiner* — Alvin L Lee
(74) *Attorney, Agent, or Firm* — Sughrue Mion, PLLC

(57) ABSTRACT

An electronic device including a light emitting display device includes: a first data conductive layer, a second data conductive layer, a green light emitting diode (LED) anode, a red light emitting diode (LED) anode, and a blue light emitting diode (LED) anode positioned on the second organic layer; a pixel definition layer including a green opening overlapping the green light emitting diode (LED) anode, a red opening overlapping the red light emitting diode (LED) anode, and a blue opening overlapping the blue light emitting diode (LED) anode. The first data conductive layer include a first expansion overlapping the red opening or the blue opening of the pixel definition layer, the second data conductive layer includes a second expansion overlapping the green opening of the pixel definition layer, and the second expansion of the second data conductive layer entirely overlaps the green opening of the pixel definition layer.

20 Claims, 28 Drawing Sheets

(51) Int. Cl.
 *H10K 59/131* (2023.01)
 *H10K 59/40* (2023.01)
 *H10K 59/65* (2023.01)
 *H10K 59/80* (2023.01)
(52) U.S. Cl.
 CPC ......... *H10K 59/122* (2023.02); *H10K 59/131* (2023.02); *H10K 59/40* (2023.02); *H10K 59/65* (2023.02); *H10K 59/8792* (2023.02)
(58) Field of Classification Search
 CPC .... H10K 59/40; H10K 59/65; H10K 59/8792; H10K 50/81; H10K 50/82; H10K 50/841; H10K 50/844; H10K 50/865; H10K 59/124; H10K 59/35; H10K 59/60; H10H 29/142; H10H 20/831; H10H 20/85; H10H 20/851; H10D 86/441; H10D 86/60
 See application file for complete search history.

(56) References Cited

U.S. PATENT DOCUMENTS

| | | | |
|---|---|---|---|
| 2021/0273145 A1 | 9/2021 | Lee | |
| 2021/0320164 A1 | 10/2021 | Lee et al. | |
| 2022/0109040 A1* | 4/2022 | Jung | G09G 3/3233 |
| 2022/0130915 A1* | 4/2022 | Son | H10K 59/122 |
| 2024/0177659 A1* | 5/2024 | Liu | H10K 59/35 |

FOREIGN PATENT DOCUMENTS

| | | |
|---|---|---|
| KR | 10-2016-0148113 | 12/2016 |
| KR | 10-2151609 | 9/2020 |
| KR | 10-2021-0110464 A | 9/2021 |
| KR | 10-2021-0126838 A | 10/2021 |
| KR | 10-2021-0142025 | 11/2021 |
| KR | 10-2022-0053756 A | 5/2022 |

* cited by examiner

GAT1:151,151a,155,1151

DR2

DR1

DR3

GAT2:127,152a,153a,1152,1153

GAT3:128a,152b,153b,3151,4151

| | | Comparative example | Embodiment |
|---|---|---|---|
| Structure | | | |
| Flatness | G | 20 | 14 |
| | R/B | 16/30 | 27/33 |
| Reflective color band | | | |
| | | 42 | 29 |

FIG. 26

| | Green | Blue / Red | Anode flatness |
|---|---|---|---|
| Compa -rative example | | | OPg OPb |
| | 20nm | 30nm | |
| Embodi -ment | | | OPb OPg |
| | 13nm (VIA3 Slit Removal) | 31nm (Lower slit area adjustment) | |

LIGHT EMITTING DISPLAY DEVICE AND ELECTRONIC DEVICE HAVING THE SAME

CROSS-REFERENCE TO RELATED APPLICATION(S)

This application claims priority to and benefits of Korean Patent Application No. 10-2022-0056856 under 35 U.S.C. § 119, filed on May 9, 2022, in the Korean Intellectual Property Office, the entire contents of which are incorporated herein by reference.

BACKGROUND

1. Technical Field

Embodiments relate to a light emitting display device and an electronic device including the light emitting display device.

2. Description of the Related Art

A display device displays an image, and includes a liquid crystal display (LCD), an organic light emitting diode (OLED) display, and the like. The display device is applied to various electronic devices such as a mobile phone, a navigation device, a digital camera, an electronic book, a portable game machine, and various terminals.

The display device such as the organic light emitting display device may have a structure in which the display device may be bent or folded by using a flexible substrate.

In small electronic devices such as portable phones, optical elements such as cameras and optical sensors are formed in a bezel area, which is a peripheral area of the display area. However, as the size of the screen for display is increased, the size of the peripheral area of the display area has been gradually reduced. Thus, a technology that implements the cameras or the optical sensors to be positioned on the back side of the display area is being developed.

The above information disclosed in this Background section is only for enhancement of understanding of the background of the described technology, and therefore it may contain information that does not form the prior art that is already known in this country to a person of ordinary skill in the art.

SUMMARY

Embodiments provide an electronic device including a light emitting display device capable of improving display quality by reducing a green reflective color band generated by asymmetrically reflecting external light passing through a green color filter.

However, embodiments of the disclosure are not limited to those set forth herein. The above and other embodiments will become more apparent to one of ordinary skill in the art to which the disclosure pertains by referencing the detailed description of the disclosure given below.

In an embodiment, a light emitting display device include a lower panel layer including: a first semiconductor layer; a first gate insulating layer; a first gate conductive layer; a second gate insulating layer; a second gate conductive layer; a first interlayer insulating layer; a second semiconductor layer; a third gate insulating layer; a third gate conductive layer; a second interlayer insulating layer; a first data conductive layer; a first organic layer; a second data conductive layer; and a second organic layer, which are sequentially stacked on a substrate, a green light emitting diode (LED) anode, a red light emitting diode (LED) anode, and a blue light emitting diode (LED) anode positioned on the second organic layer; a pixel definition layer including a green opening overlapping the green light emitting diode (LED) anode, a red opening overlapping the red light emitting diode (LED) anode, and a blue opening overlapping the blue light emitting diode (LED) anode; a cathode positioned on the green light emitting diode (LED) anode, the red light emitting diode (LED) anode, the blue light emitting diode (LED) anode, and the pixel definition layer; and an encapsulation layer covering the cathode; and an upper panel layer including: a light blocking layer positioned on the encapsulation layer and including a green color filter opening, a red color filter opening, and a blue color filter opening; a green color filter positioned in the green color filter opening; a red color filter positioned in the red color filter opening; and a blue color filter positioned in the blue color filter opening, the first data conductive layer may include a first expansion overlapping the red opening or the blue opening of the pixel definition layer, the second data conductive layer may include a second expansion overlapping the green opening of the pixel definition layer, and the second expansion may entirely overlaps the green opening of the pixel definition layer in a plan view.

The red opening or the blue opening of the pixel definition layer may overlap a first portion of the first gate conductive layer, a second portion of the second gate conductive layer, and a third portion of a third gate conductive layer, and distances between the first portion, the second portion, and the third portion may be substantially same in a plan view.

The second portion of the second gate conductive layer may be adjacent to a side of the first portion of the first gate conductive layer, the third portion may be adjacent to another side of the first portion of the first gate conductive layer, and a distance between the first portion of the first gate conductive layer and the second portion of the second gate conductive layer and a distance between the first portion of the first gate conductive layer and the third portion of the third gate conductive layer may be substantially same as each other in a plan view.

The first portion of the first gate conductive layer may be a light emitting control line, the second portion of the second gate conductive layer may be a connection part of a first storage electrode, and the third portion of the third gate conductive layer may be a second initialization voltage line.

The lower panel layer may further include a plurality of pixel circuit parts electrically connected to the green light emitting diode (LED), the red light emitting diode (LED), and the blue light emitting diode (LED), respectively, each of the plurality of pixel circuit parts may include a driving transistor that transmits a current to the green light emitting diode (LED), the red light emitting diode (LED), or the blue light emitting diode (LED), a fifth transistor that transmits a driving voltage to a first electrode of the driving transistor, a sixth transistor electrically connected to a second electrode of the driving transistor to transmit a current to the green light emitting diode (LED), the red light emitting diode (LED), or the blue light emitting diode (LED), a seventh transistor that initializes the red light emitting diode (LED) anode, the blue light emitting diode (LED) anode, or the green light emitting diode (LED) anode, and a storage capacitor storing a voltage of a gate electrode of the driving transistor, the first storage electrode may overlap the gate electrode of the driving transistor to form the storage capacitor, the light emitting control line may be electrically connected to a gate electrode of the fifth transistor and a gate electrode of the sixth transistor, and the second initialization voltage line may be electrically connected to the seventh transistor.

Each of the plurality of pixel circuit parts may further include: a second transistor that transmits a data voltage to the first electrode of the driving transistor; a third transistor electrically connecting the second electrode of the driving transistor and the gate electrode of the driving transistor; and a fourth transistor that initializes the gate electrode of the driving transistor.

The connection part of the first storage electrode may have an upper side spaced apart from the upper side of the first storage electrode by a distance.

The light emitting control line may extend in a first direction, and the distance between the first portion of the first gate conductive layer and the second portion of the second gate conductive layer and the distance between the first portion of the first gate conductive layer and the third portion of the third gate conductive layer may be a distance in a second direction perpendicular to the first direction.

The lower panel layer may include: a metal layer and a buffer layer sequentially stacked between the substrate and the first semiconductor layer; a spacer positioned on the pixel definition layer; an emission layer positioned in the green opening, the red opening, and the blue opening of the pixel definition layer; and a functional layer positioned between the green light emitting diode (LED) anode, the red light emitting diode (LED) anode, and the blue light emitting diode (LED) anode, and the cathode.

The upper panel layer may further include: a plurality of sensing electrodes that sense a touch; and a plurality of sensing insulating layers positioned between a plurality of sensing electrodes.

A polarizer may not be attached to an entire surface of the green color filter, the red color filter, and the blue color filter.

The first expansion of the first data conductive layer may overlap the red opening or the blue opening of the pixel definition layer, and the second expansion of the second data conductive layer may overlap the green opening of the pixel definition layer.

In an embodiment, an electronic device may include: a housing including a back surface and a side surface; a cover window disposed above the housing; a display panel disposed under the cover window and including a display area and a component area surrounded by the display area; and an optical sensor disposed in the component area of the display panel, wherein the display panel may include a lower panel layer including: a first semiconductor layer; a first gate insulating layer; a first gate conductive layer; a second gate insulating layer; a second gate conductive layer; a first interlayer insulating layer; a second semiconductor layer; a third gate insulating layer; a third gate conductive layer; a second interlayer insulating layer; a first data conductive layer; a first organic layer; a second data conductive layer; and a second organic layer, which are sequentially stacked on a substrate, a green light emitting diode (LED) anode, a red light emitting diode (LED) anode, and a blue light emitting diode (LED) anode positioned on the second organic layer; a pixel definition layer including a green opening overlapping the green light emitting diode (LED) anode, a red opening overlapping the red light emitting diode (LED) anode, and a blue opening overlapping the blue light emitting diode (LED) anode; a cathode positioned on the green light emitting diode (LED) anode, the red light emitting diode (LED) anode, the blue light emitting diode (LED) anode, and the pixel definition layer; and an encapsulation layer covering the cathode; and an upper panel layer including: a light blocking layer positioned on the encapsulation layer and including a green color filter opening, a red color filter opening, and a blue color filter opening; a green color filter positioned in the green color filter opening; a red color filter positioned in the red color filter opening; and a blue color filter positioned in the blue color filter opening, the first data conductive layer may include a first expansion overlapping the red opening or the blue opening of the pixel definition layer, the second data conductive layer may include a second expansion overlapping the green opening of the pixel definition layer, and the second expansion of the second data conductive layer may entirely overlap the green opening of the pixel definition layer in a plan view.

The red opening or the blue opening of the pixel definition layer may overlap a first portion of the first gate conductive layer, a second portion of the second gate conductive layer, and a third portion of a third gate conductive layer, and distances between the first portion, the second portion, and the third portion may be substantially same in a plan view.

The second portion of the second gate conductive layer may be adjacent to a side based on the first portion of the first gate conductive layer, and the third portion of the third gate conductive layer may be adjacent to another side of the first portion of the first gate conductive layer, and a distance between the first portion of the first gate conductive layer and the second portion of the second gate conductive layer and a distance between the first portion of the first gate conductive layer and the third portion of the third gate conductive layer may be substantially same in a plan view.

The first portion of the first gate conductive layer may be a light emitting control line, the second portion of the second gate conductive layer may be a connection part of a first storage electrode, and the third portion of the third gate conductive layer may be a second initialization voltage line.

The lower panel layer may further include a plurality of pixel circuit parts electrically connected to the green light emitting diode (LED), the red light emitting diode (LED), and the blue light emitting diode (LED), each of the plurality of pixel circuit parts may include: a driving transistor that transmits a current to the green light emitting diode (LED), the red light emitting diode (LED), or the blue light emitting diode (LED); a fifth transistor that transmits a driving voltage to a first electrode of the driving transistor; a sixth transistor electrically connected to a second electrode of the driving transistor to transmit a current to the green light emitting diode (LED), the red light emitting diode (LED), or the blue light emitting diode (LED); a seventh transistor that initializes the red light emitting diode (LED) anode, the blue light emitting diode (LED) anode, or the green light emitting diode (LED) anode; and a storage capacitor that stores a voltage of a gate electrode of the driving transistor, the first storage electrode may overlap the gate electrode of the driving transistor to form the storage capacitor, the light emitting control line may be electrically connected to a gate electrode of the fifth transistor and a gate electrode of the sixth transistor, and the second initialization voltage line may be electrically connected to the seventh transistor.

Each of the plurality of pixel circuit parts may further include: a second transistor that transmits a data voltage to the first electrode of the driving transistor; a third transistor electrically connecting the second electrode of the driving transistor and the gate electrode of the driving transistor; and a fourth transistor that initializes the gate electrode of the driving transistor.

The connection part of the first storage electrode may have an upper side spaced apart from the upper side of the first storage electrode.

The light emitting control line may extend in a first direction, and the distance between the first portion of the first gate conductive layer and the second portion of the second gate conductive layer and the distance between the first portion of the first gate conductive layer and the third portion of the third gate conductive layer may be distances in a second direction perpendicular to the first direction.

According to the embodiments, as the polarizer is not formed on the entire surface, in case that incident external light is reflected from the anode, the flatness of the anode is improved so that the reflected light does not spread asymmetrically, thereby reducing a color spread (e.g., a color separation) phenomenon caused by the reflected light and improving a display quality. As this color spread phenomenon is readily recognized by the user in case that the green light spreads asymmetrically, the anode positioned under the green color filter is formed flatter, so that the green light spreads symmetrically, thereby reducing the color spread phenomenon recognized by the user.

For example, the gate conductive layer positioned under the anode is positioned at a regular interval (or distance) so that it is formed symmetrically based on the opening of the anode or pixel definition layer, so that the anode is evenly flat, so that the reflected light does not spread asymmetrically.

It is possible to reduce the ratio of reflected external light by using a black pixel definition layer as a pixel definition layer that separates the emission layers from each other instead of a polarizer.

BRIEF DESCRIPTION OF THE DRAWINGS

FIG. 24 to FIG. 27 are schematic views comparing a characteristic difference based on a comparative example and an embodiment.

DETAILED DESCRIPTION OF THE EMBODIMENTS

Figure 1:
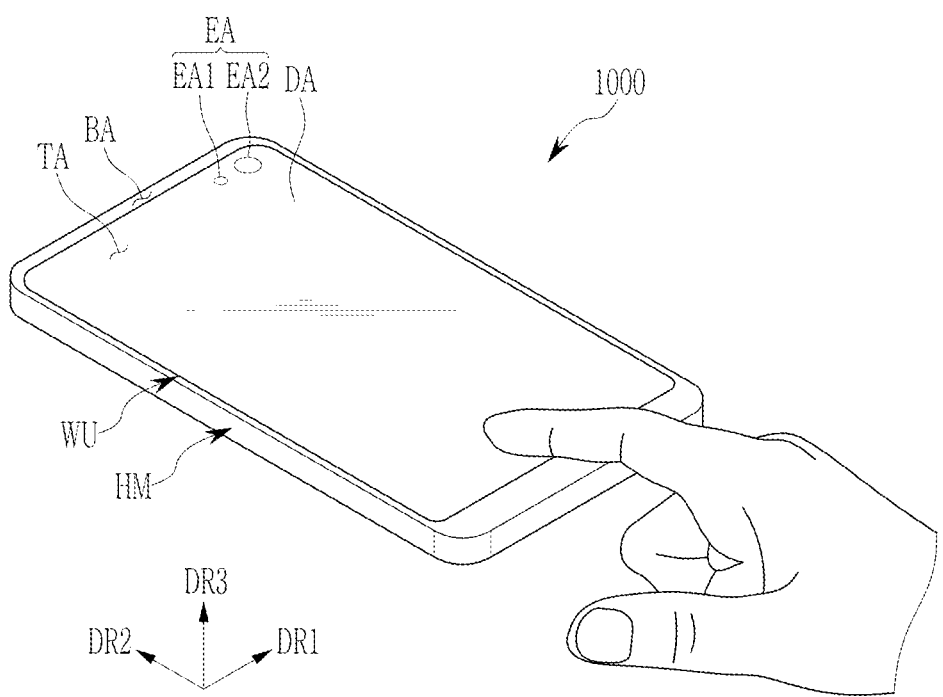
FIG. 1 is a schematic perspective view showing a use state of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

For example, electronic devices (e.g., a mobile phone, a TV, a monitor, a laptop computer, etc.) included in display devices and display panels described in the specification, or electronic devices included in display devices and display panels, etc. manufactured by manufacturing methods described in the specification, are not excluded from a scope of this description.

Figure 2:
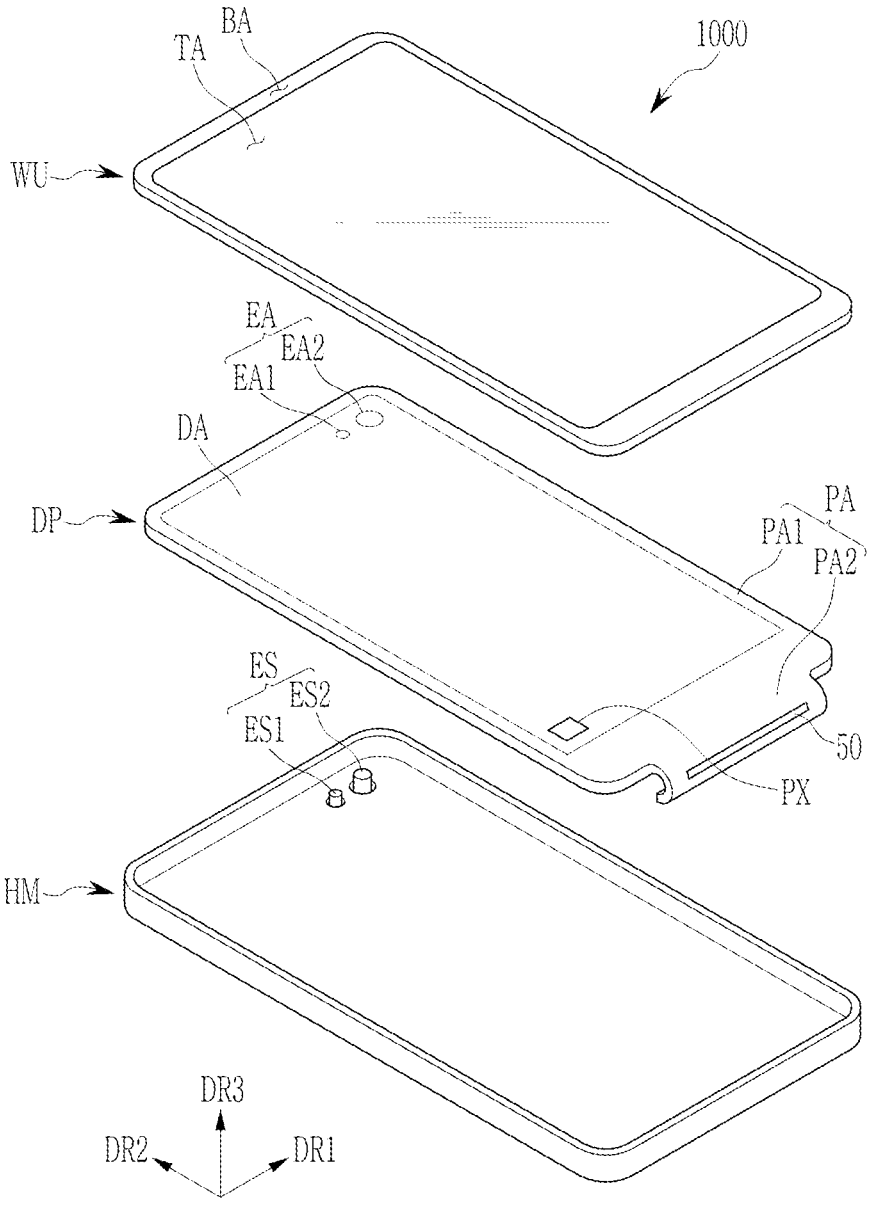
FIG. 2 is a schematic exploded perspective view of a display device according to an embodiment.
Figure 3:
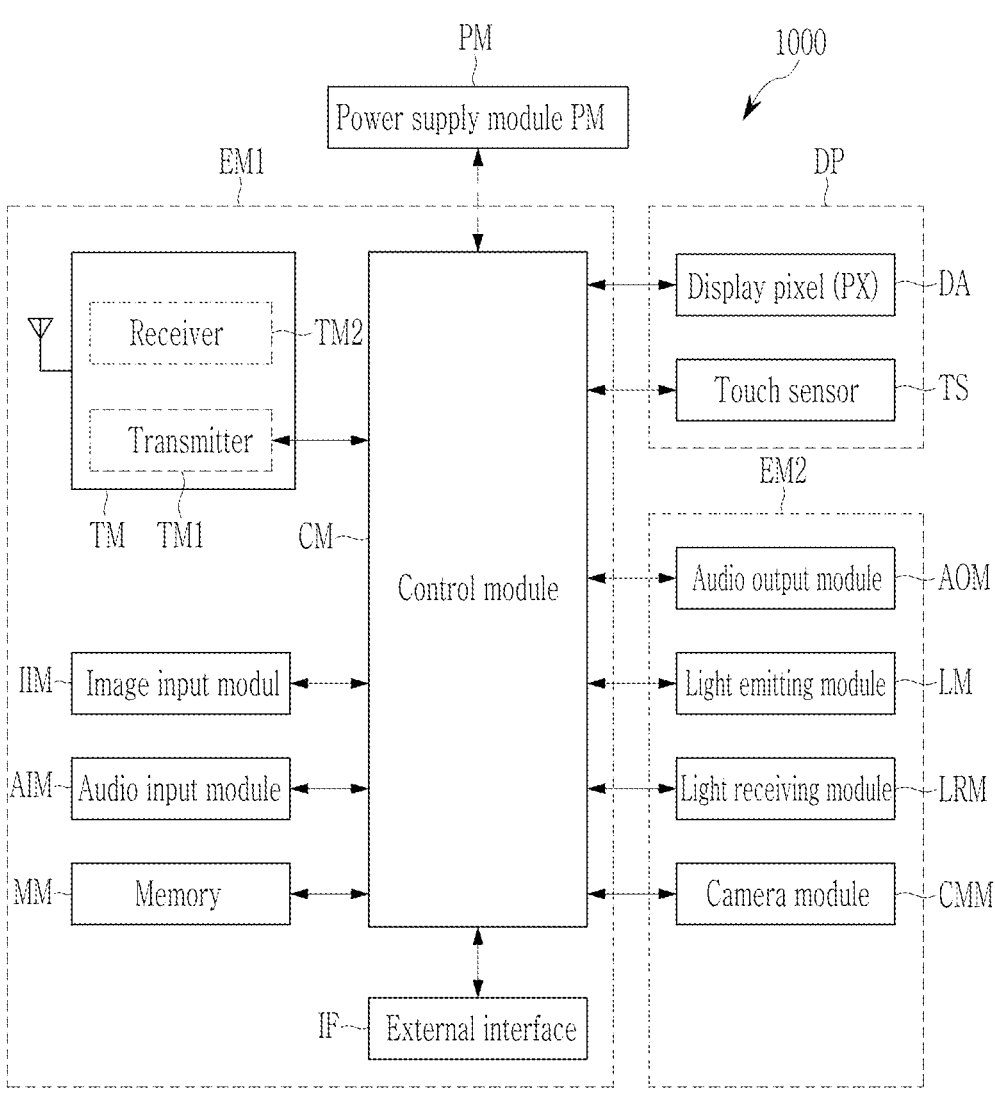
FIG. 3 is a schematic block diagram of a display device according to an embodiment.

Hereinafter, a schematic structure of a display device is described with reference to FIG. 1 to FIG. 3. FIG. 1 is a schematic perspective view showing a use state of a display device according to an embodiment, FIG. 2 is a schematic exploded perspective view of a display device according to an embodiment, and FIG. 3 is a schematic block diagram of a display device according to an embodiment.

Referring to FIG. 1, a display device 1000 according to an embodiment is a device for displaying a motion picture or a still image, and may be used as a display screen of various products such as a television, a laptop, a monitor, an advertisement board, the Internet of things (IOT), etc., as well as portable electronic devices such as a mobile phone, a smart phone, a tablet personal computer, a mobile communication terminal, an electronic notebook, an e-book, a PMP (portable multimedia player), a navigation device, a UMPC (Ultra Mobile PC), etc. For example, the display device 1000 according to an embodiment may be used in a wearable device such as a smart watch, a watch phone, a glasses display, and a head mounted display (HMD). For example, the display device 1000 according to an embodiment may be used as an instrument panel of a car, and a center fascia of the car or a CID (Center Information Display) disposed on a dashboard, a room mirror display that replaces a side mirror of the car, an entertainment device for a rear seat of the car, or a display disposed on the rear surface of the front seat. FIG. 1 shows that the display device 1000 is used as a smartphone for better comprehension and ease of description.

The display device 1000 may display an image in a third direction DR3 on a display surface parallel to each of a first direction DR1 and a second direction DR2. The display surface on which the image is displayed may correspond to the front surface of the display device 1000, and may correspond to the front surface of a cover window WU. The images may include static images as well as dynamic images.

In an embodiment, a front surface (or an upper surface) and a rear surface (or a lower surface) of each member may be defined based on the direction in which the image is displayed. The front surface and the rear surface may be opposed to each other in the third direction DR3, and the normal directions of each of the front and the rear surfaces may be parallel to the third direction DR3. The separation distance in the third direction DR3 between the front surface and the rear surface may correspond to the thickness in the third direction DR3 of the display panel.

The display device 1000 according to an embodiment may detect an input (e.g., a hand in FIG. 1) of a user applied from the outside. The input of the user may include various types of external inputs such as a part of the user's body, light, heat, or pressure. In an embodiment, the user's input is shown with the user's hand applied to the front. For example, embodiments are not limited thereto. The user's input may be provided in various forms, and the display device 1000 may sense the user's input applied to the side surface or the rear surface of the display device 1000 according to the structure of the display device 1000.

Referring to FIG. 1 and FIG. 2, the display device 1000 may include a cover window WU, a housing HM, a display panel DP, and an optical element ES. In an embodiment, the cover window WU and the housing HM may be combined to form the appearance of the display device 1000.

The cover window WU may include an insulating panel. For example, the cover window WU may be made of glass, plastic, or a combination thereof.

The front surface of the cover window WU may define the front surface of the display device 1000. The transmissive area TA may be an optically transparent area. For example, the transmissive area TA may be an area having visible ray transmittance of about 90% or more.

The blocking area BA may define the shape of the transmissive area TA. The blocking area BA may be adjacent to the transmissive area TA and may surround the transmissive area TA. The blocking area BA may be an area having relatively low light transmittance compared to the transmissive area TA. The blocking area BA may include an opaque material that blocks light. The blocking area BA may have a certain color. The blocking area BA may be defined by a bezel layer provided separately from the transparent substrate defining the transmissive area TA, or may be defined by an ink layer formed by inserting it into or coloring the transparent substrate.

The display panel DP may include a display panel DP displaying an image and a driving part 50, and the display pixel PX may be positioned within the display area DA. The display panel DP may include the front surface including a display area DA and a non-display area PA. The display area DA may be an area in which a pixel operates and emits light according to an electrical signal. In an embodiment, the display area DA may be an area in which the image is displayed including the pixel, and may be an area in which an external input is sensed by simultaneously positioning a touch sensor on the upper side in the third direction DR3 of the pixel.

The transmissive area TA of the cover window WU may at least partially overlap the display area DA of the display panel DP. For example, the transmissive area TA may overlap the front surface of the display area DA or may overlap at least a portion of the display area DA. Accordingly, the user may recognize the image through the transmissive area TA or provide the external input based on the image. However, embodiments are not limited thereto. For example, in the display area DA, an area in which the image is displayed and an area in which the external input is detected may be separated from each other.

The non-display area PA of the display panel DP may at least partially overlap the blocking area BA of the cover window WU. The non-display area PA may be an area covered by the blocking area BA. The non-display area PA may be adjacent to the display area DA and may surround the display area DA. The image may not be displayed in the non-display area PA, and a driving circuit or driving wiring for driving the display area DA may be disposed. The non-display area PA may include a first peripheral area PA1 positioned outside the display area DA and a second peripheral area PA2 including a driving part 50, connection wiring, and a bending area. In the embodiment of FIG. 2, the first peripheral area PA1 may be positioned on three sides of the display area DA, and the second peripheral area PA2 may be positioned on the other side of the display area DA.

In an embodiment, the display panel DP may be assembled in a flat state in which the display area DA and the non-display area PA face the cover window WU. However, embodiments are not limited thereto. The part of the non-display area PA of the display panel DP may be bent. For example, the portion of the non-display area PA may face the rear surface of the display device 1000, so that the blocking area BA shown on the front surface of the display device 1000 may be reduced, and as shown in FIG. 2, the second peripheral area PA2 may be bent to be positioned on the rear surface of the display area DA, and assembled.

For example, the display area DA of the display panel DP may include a component area EA, and may include a first component area EA1 and a second component area EA2. The first component area EA1 and the second component area EA2 may be at least partially surrounded by the display area DA. Although the first component area EA1 and the second component area EA2 are shown to be spaced apart from each other, embodiments are not limited thereto, and at least some of them may be connected. The first component area EA1 and the second component area EA2 may be areas in which a component using infrared rays, visible rays, or a sound is disposed below the first component area EA1 and the second component area EA2.

The display area DA may include light emitting diodes (LEDs), and pixel circuit parts for generating and transmitting a light emitting current to each of light emitting diodes (LEDs). For example, one light emitting diode LED and one pixel circuit part are referred to as a pixel PX. In the display area DA, one pixel circuit part and one light emitting diode LED may be formed one-to-one.

The first component area EA1 may include a transmissive part through which light or/and sound may pass and a display part including pixels. The transmissive part may be positioned between adjacent pixels and may be composed of a layer through which light or/and sound may pass. The display part may be formed to have one unit structure by adding pixels, and the transmissive part may be positioned between adjacent unit structures. According to an embodiment, a layer through which light is not transmitted, such as a light blocking layer, may overlap the first component area EA1.

The second component area EA2 may include an area composed of a transparent layer to transmit light to pass through, a conductive layer or a semiconductor layer may not be positioned, and a pixel defining layer and a light blocking layer including a light blocking material including an opening overlapping the position corresponding to the second component area EA2, thereby having a structure that does not block light.

Referring to FIG. 3, the display panel DP may further include a touch sensor TS in addition to the display area DA including the display pixel PX. The display panel DP may be visually recognized by the user from the outside through the transmissive area TA including the pixel that generates the image. For example, the touch sensor TS may be positioned on the pixel, and may detect the external input applied from the outside. The touch sensor TS may detect the external input provided to the cover window WU.

Referring to FIG. 2, the second peripheral area PA2 may include a bending part. The display area DA and the first peripheral area PA1 may have a flat state substantially parallel to the plane defined by the first direction DR1 and the second direction DR2, and a side of the second peripheral area PA2 may extend from the flat state and have the flat state again after going through the bending part. As a result, at least a part of the second peripheral area PA2 may be bent and assembled to be positioned on the rear surface side of the display area DA. At least a portion of the second peripheral area PA2 may overlap the display area DA in a plan view in case that display device 1000 is assembled, so that the blocking area BA of the display device 1000 may be reduced. However, embodiments are not limited thereto. For example, the second peripheral area PA2 may not be bent.

The driving part 50 may be mounted on the second peripheral area PA2, and may be mounted on the bending part or positioned on one of sides (e.g., opposite sides) of the bending part. The driving part 50 may be provided in the form of a chip.

The driving part 50 may be connected (e.g., electrically connected) to the display area DA to transmit an electrical signal to the display area DA. For example, the driving part 50 may provide data signals to the pixels PX disposed in the display area DA. In another example, the driving part 50 may include a touch driving circuit and may be connected (e.g., electrically connected) to the touch sensor TS disposed in the display area DA. For example, the driving part 50 may be designed to include various circuits in addition to the above-described circuits or to provide various electrical signals to the display area DA.

Further, a pad part may be positioned at the end portion of the second peripheral area PA2, and the display device 1000 may be connected (e.g., electrically connected) to a flexible printed circuit board (FPCB) including a driving chip by the pad part. For example, the driving chip positioned on the flexible printed circuit board may include various driving circuits for driving the display device 1000 or connectors for power supply. According to an embodiment, instead of the flexible printed circuit board, a rigid printed circuit board (PCB) may be used.

The optical element ES may be disposed under the display panel DP. The optical element ES may include a first optical element ES1 overlapping the first component area EA1 and a second optical element ES2 overlapping the second component area EA2. The first optical element ES1 may use infrared rays. For example, the first component area EA1 may overlap a layer that does not transmit light, such as a light blocking layer.

The first optical element ES1 may be an electronic element using light or sound. For example, the first optical element ES1 may be a sensor that receives and uses light such as an infrared sensor, a sensor that outputs and senses light or sound to measure a distance or recognize a fingerprint, a small lamp that outputs light, or a speaker that outputs a sound, etc. Of course, in the case of the electronic element using light, light of various wavelength bands such as visible light, infrared light, and ultraviolet light may be used.

The second optical element ES2 may be at least one of a camera, an infrared camera (IR camera), a dot projector, an infrared illuminator, and a time-of-flight sensor (ToF sensor).

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be connected (e.g., electrically connected) to each other. In FIG. 3, the display pixel and the touch sensor TS positioned in the display area DA among the configurations of the display panel DP are shown as an example.

The power supply module PM may supply power for the overall operation of the display device 1000. The power supply module PM may include a conventional battery module.

The first electronic module EM1 and the second electronic module EM2 may include various functional modules for operating the display device 1000. The first electronic module EM1 may be mounted (e.g., directly mounted) on the motherboard connected (e.g., electrically connected) to the display panel DP, or mounted on a separate substrate and connected (e.g., electrically connected) to the motherboard through a connector.

The first electronic module EM1 may include a control module CM, a wireless communication module TM, an image input module IIM, an audio input module AIM, a memory MM, and an external interface IF. Some of the modules may not be mounted on the motherboard and may be connected (e.g., electrically connected) to the motherboard through a flexible printed circuit board connected thereto.

The control module CM may control the overall operation of the display device 1000. The control module CM may be a microprocessor. For example, the control module CM may activate or deactivate the display panel DP. The control module CM may control other modules such as the image input module IIM or the audio input module AIM based on the touch signal received from the display panel DP.

The wireless communication module TM may transmit or receive a wireless signal with other terminals using Bluetooth or Wi-Fi. The wireless communication module TM may transmit or receive voice signals by using a general communication line. The wireless communication module TM may include a transmitter TM1 that modulates and transmits a signal to be transmitted, and a receiver TM2 that demodulates a received signal.

The image input module IIM may process the image signal to be converted into image data that are displayed on the display panel DP. The audio input module AIM may receive an external sound signal by a microphone in a recording mode, a voice recognition mode, etc. to be converted into electrical voice data.

The external interface IF may function as an interface connected (e.g., electrically connected) to an external charger, a wired/wireless data port, or a card socket (e.g., a memory card, a SIM/UIM card).

The second electronic module EM2 may include an audio output module AOM, a light emitting module LM, a light receiving module LRM, and a camera module CMM, and at least some of these as the optical elements ES, as shown in FIG. 1 and FIG. 2, may be positioned on the rear surface of the display panel DP. The optical element ES may include a light emitting module LM, a light receiving module LRM, and a camera module CMM. For example, the second electronic module EM2 may be mounted (e.g., directly mounted) on the motherboard, or mounted on a separate substrate and connected (e.g., electrically connected) to the display panel DP through a connector, or connected (e.g., electrically connected) to the first electronic module EM1.

The audio output module AOM may convert audio data received from the wireless communication module TM or audio data stored in the memory MM to be output to the outside.

The light emitting module LM may generate and output light. The light emitting module LM may output infrared light. For example, the light emitting module LM) may include an LED element. For example, the light-receiving module LRM may detect infrared light. The light receiving module LRM may be activated in case that infrared light above a certain level is detected. The light receiving module LRM may include a CMOS sensor. After the infrared light generated by the light emitting module LM is output, the light may be reflected by an external subject (e.g., a user's finger or a face), and the reflected infrared light may be incident on the light receiving module LRM. The camera module CMM may take external images.

In an embodiment, the optical element ES may additionally include an optical detecting sensor or a thermal detecting sensor. The optical element ES may detect an external object received through the front surface or may provide a sound signal such as a voice through the front surface to the outside. For example, the optical element ES may include various configurations, and embodiments are not limited thereto.

Referring to FIG. 2, the housing HM may be combined with the cover window WU. The cover window WU may be disposed in front of the housing HM. The housing HM may be combined with the cover window WU to provide a certain accommodation space. The light emitting display panel DP and the optical element ES may be accommodated in a certain accommodation space provided between the housing HM and the cover window WU.

The housing HM may include a material with relatively high stiffness. For example, the housing HM may include frames and/or plates made of glass, plastic, or metal, or a combination thereof. The housing HM may reliably protect the components of the light emitting display device 1000 housed in the interior space from external impact.

Figure 4:
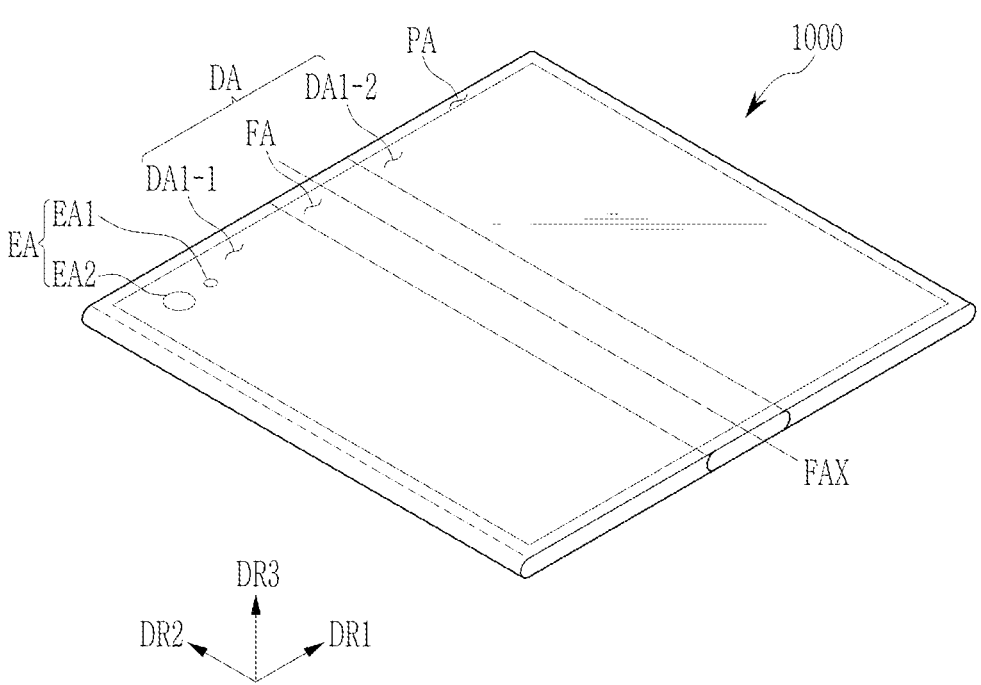
FIG. 4 is a schematic perspective view schematically showing a light emitting display device according to an embodiment.

Hereinafter, the structure of the light emitting display device 1000 according to an embodiment is described with reference to FIG. 4. FIG. 4 is a schematic perspective view schematically showing a display device according to an embodiment. The description for the same configurations of the above-described constituent elements is omitted for descriptive convenience.

The embodiment of FIG. 4 shows a foldable light emitting display device in which the light emitting display device 1000 is folded through a folding line (FAX).

Referring to FIG. 4, in an embodiment, the display device 1000 may be a foldable display device. The light emitting display device 1000 may be folded outward or inward based on the folding axis FAX. In case that the light emitting display device 1000 is folded outward based on the folding axis FAX, the display surfaces of the light emitting display device 1000 may be respectively positioned on the outside in the third direction DR3, so that the images may be displayed in both directions. In case that being folded inward based on the folding axis FAX, the display surface may not be visually recognized from the outside.

In an embodiment, the display device 1000 may include a display area DA, a component area EA, and a non-display area PA. The display area DA may be divided into a first-first display area DA1-1, a first-second display area DA1-2, and a folding area FA. The first-first display area DA1-1 and the first-second display area DA1-2 may be positioned on the left and right sides, respectively, with respect to (or at the center) the folding axis FAX, and the folding area FA may be positioned between the first-first display area DA1-1 and the first-second display area DA1-2. At this time, with being folded outward based on the folding axis FAX, the first-first display area DA1-1 and the first-second display area DA1-2 may be positioned on sides (e.g., opposite sides) in the third direction DR3, and the images may be displayed in both directions. In case that being folded inward based on the folding axis FAX, the first-first display area DA1-1 and the first-second display area DA1-2 may not be visually recognized from the outside.

Figure 5:
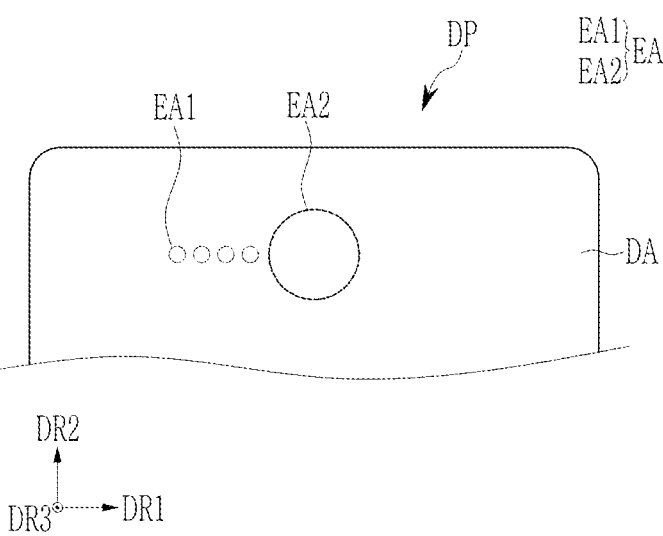
FIG. 5 is a schematic top plan view enlarging and showing some area of a light emitting display device according to an embodiment.

FIG. 5 is a schematic top plan view enlarging and showing a partial area of a light emitting display device according to an embodiment.

FIG. 5 shows a part of the light emitting display panel DP among the light emitting display devices according to an embodiment, and is illustrated using a display panel for a mobile phone.

The light emitting display panel DP may have a display area DA positioned on the front surface and may include a component area EA on the front surface, and may include a first component area EA1 and a second component area EA2. In the embodiment of FIG. 5, the first component area EA1 may be positioned in the position adjacent to the second component area EA2. In the embodiment of FIG. 5, the first component area EA1 may be positioned to the left of the second component area EA2. The position and number of first component areas EA1 may vary according to embodiments. In FIG. 5, the second optical element ES2 corresponding to the second component area EA2 may be a camera, and the first optical element ES1 corresponding to the first component area EA1 may be an optical sensor.

In the display area DA, light emitting diodes (LEDs), and pixel circuit parts for generating and transmitting light emitting currents to each of light emitting diodes (LEDs) may be formed. For example, one light emitting diode LED and one pixel circuit part are referred to as a pixel PX. In the display area DA, one pixel circuit part and one light emitting diode LED may be formed one-to-one. The display area DA may be hereinafter referred to as a normal display area. In FIG. 5, the structure of the light emitting display panel DP under the cut line is not shown, but the display area DA may be positioned under the cut line.

The first component area EA1 may include a transparent layer to transmit light to pass through, the transparent layer may not have a conductive layer or a semiconductor layer and may have a sub-photosensor area in a lower panel layer (e.g., LOW PL in FIG. 20 or 28), and in the light blocking layer 220 and the color filter layer 230 of the upper panel layer (e.g., UP_PL in FIG. 20 or 28), an opening (hereinafter referred to as an additional opening) may be formed at a position corresponding to the sub-photosensor area, thereby having a structure that does not block light. For example, in case that the photosensor area is positioned in the lower panel layer (e.g., LOW PL in FIG. 20 or 28) may, in case that there is no corresponding opening in the upper panel layer (e.g., UP_PL in FIG. 20 or 28), the display area DA may not include the first component area EA1. FIG. 7 to FIG. 20 described below show one pixel and one sub-photosensor area, and it may have the pixel structure of the first component area EA1 or the display area DA. For example, in case that the first optical element ES1 corresponding to the first component area EA1 uses infrared instead of visible rays, the first component area EA1 may overlap the light blocking layer 220 that blocks the visible rays.

Figure 20:
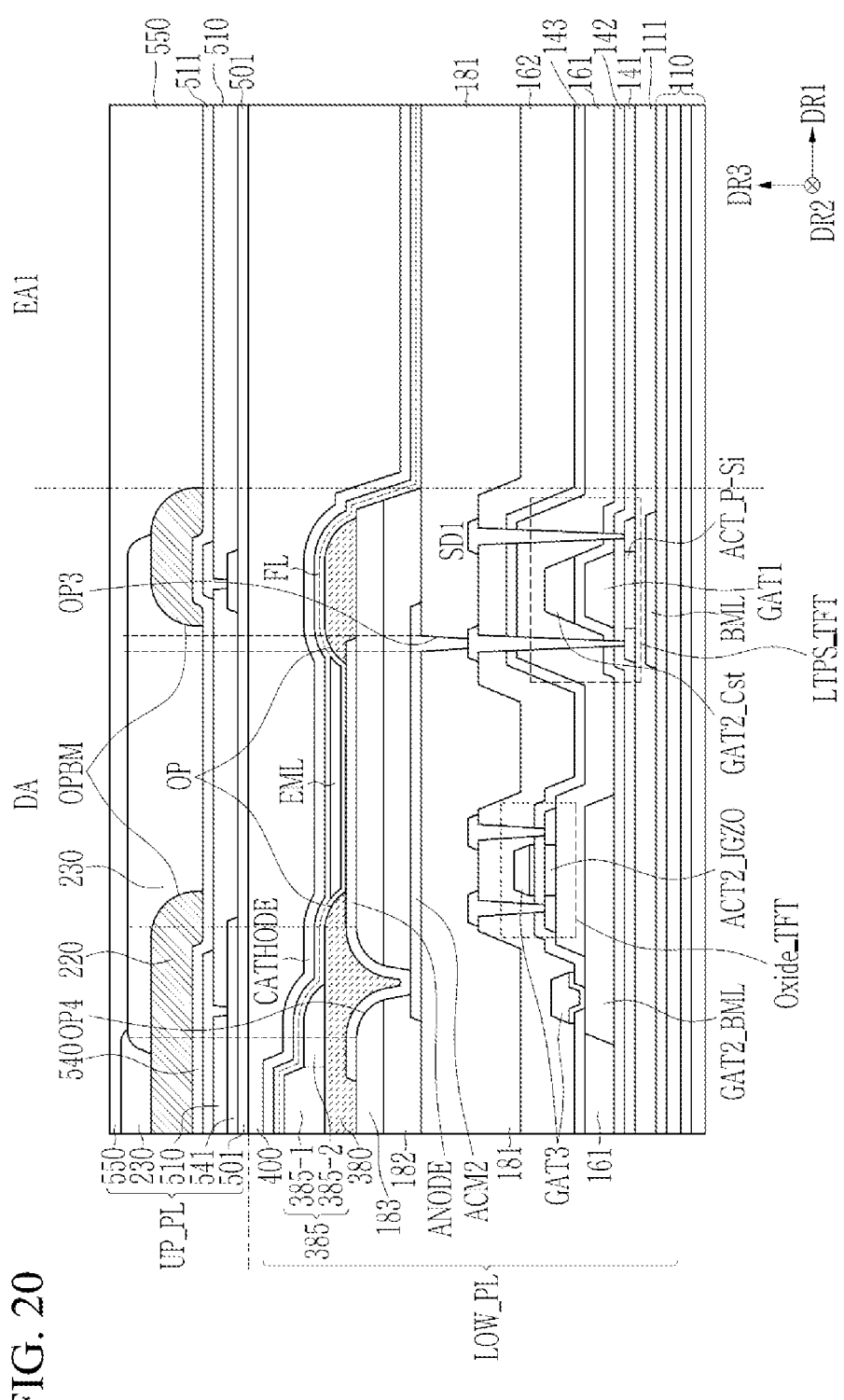
FIG. 20 is a schematic cross-sectional view of a light emitting display device according to an embodiment.
Figure 28:
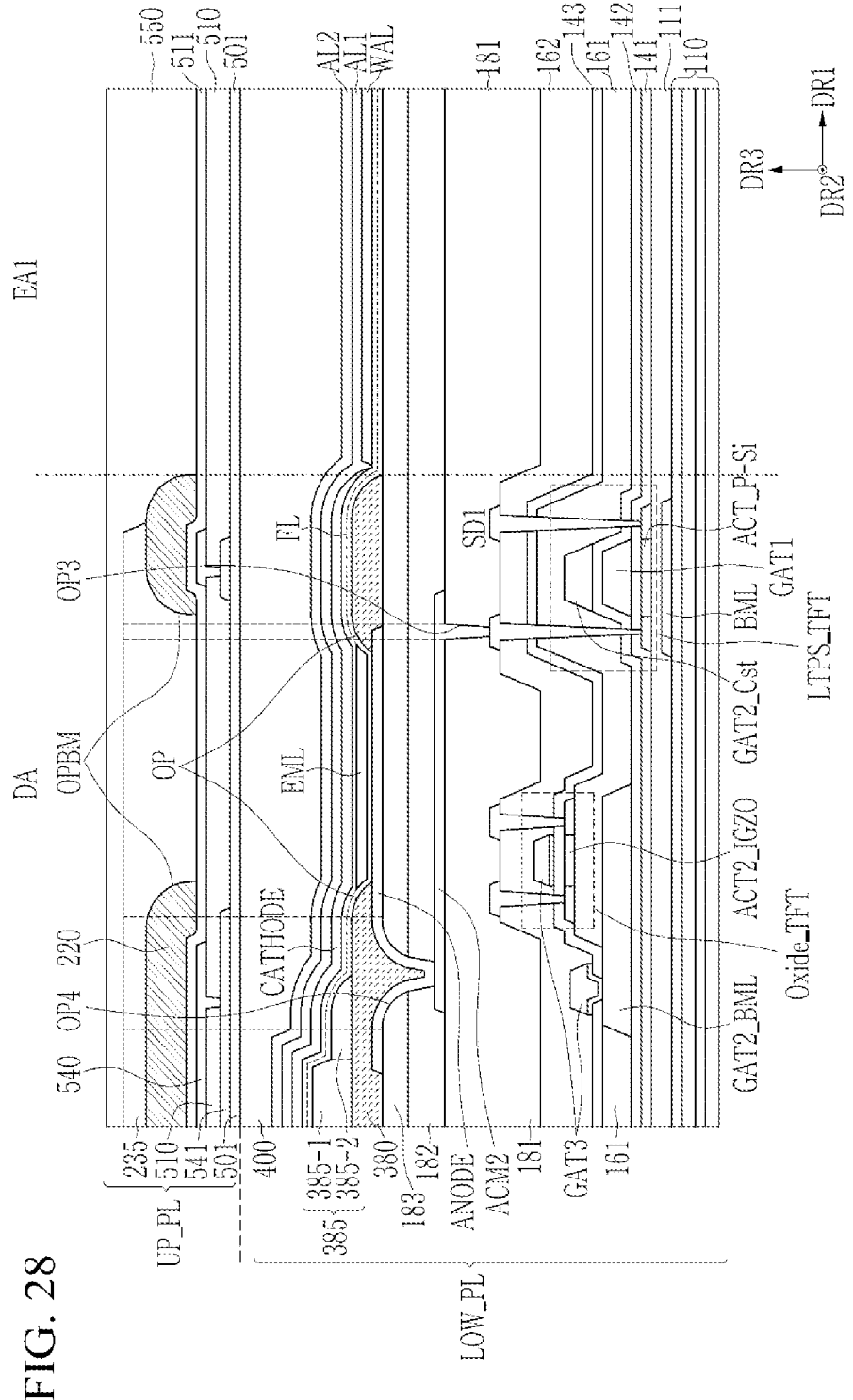
FIG. 28 is a schematic cross-sectional view of a light emitting display device according to an embodiment.

The light emitting display panel DP according to an embodiment may be largely divided into the lower panel layer (e.g., LOW PL in FIG. 20 or 28) may and the upper panel layer (e.g., UP_PL in FIG. 20 or 28). The lower panel layer (e.g., LOW PL in FIG. 20 or 28) may be the part where the light emitting diode LED and the pixel circuit part forming the pixel may be positioned, and may include an encapsulation layer (e.g., 400 of FIG. 20) that covers them. For example, the lower panel layer (e.g., LOW PL in FIG. 20 or 28) may may extend from the substrate (e.g., 110 in FIG. 20) to the encapsulation layer and may include an anode ANODE, a pixel definition layer (e.g., 380 in FIG. 20), an emission layer (e.g., EML in FIG. 20), a spacer (e.g., 385 in FIG. 20), a functional layer (e.g., FL in FIG. 20), and a cathode (e.g., CATHODE in FIG. 20), and may include an insulating layer, a semiconductor layer, and a conductive layer between the substrate and the anode. For example, the upper panel layer (e.g., UP_PL in FIG. 20 or 28) as a part positioned above the encapsulation layer may include a sensing insulating layer (e.g., 501, 510, and 511 in FIG. 20) and sensing electrodes (e.g., 540 and 541 of FIG. 20) that senses the touch, and may include a light blocking layer (e.g., 220 of FIG. 20), a color filter (e.g., 230 of FIG. 20), and a planarization layer (e.g., 550 of FIG. 20).

In the light emitting display device according to an embodiment, the polarizer may not be attached to the upper panel layer (e.g., UP_PL in FIG. 20 or 28), so external light may be reflected, but by flattening the anode where the external light is reflected to prevent the external light from being reflected asymmetrically, e.g., by preventing the external light passing through the green color filter from being asymmetrically reflected from the anode, the user may detect relatively little reflected light. This is because the user's eyes perceive green more sensitively than other colors.

For example, the structure of the lower panel layer LOW-PL of the display area DA is described based on FIG. 7 to FIG. 20.

For example, the peripheral area may be further positioned outside the display area DA. FIG. 5 shows a display panel for a mobile phone, but the embodiment may be applied as long as an optical element is positioned on the rear surface of the display panel. For example, the display panel may be the flexible display device. In the case of the foldable display device among the flexible display devices, the positions of the second component area EA2 and the first component area EA1 may be formed at different positions from those shown in FIG. 5.

Hereinafter, the circuit structure of the pixel of the lower panel layer LOW-PL of the light emitting display panel DP is described in detail with reference to FIG. 6.

The following pixel structure may be a pixel structure of the display area DA and/or the first component area EA1 including the sub-photosensor area. For example, the photosensor area may be a portion that corresponds to the first component area EA1 in case that at least a portion of the portion blocking light such as a pixel definition layer and a light blocking layer is removed. Therefore, in case that a layer (e.g., a light blocking layer in case of visible light) that causes a problem in the sensing operation of the first optical element ES1 is included in the upper part of the photosensor area, it may correspond to the display area DA.

Figure 6:
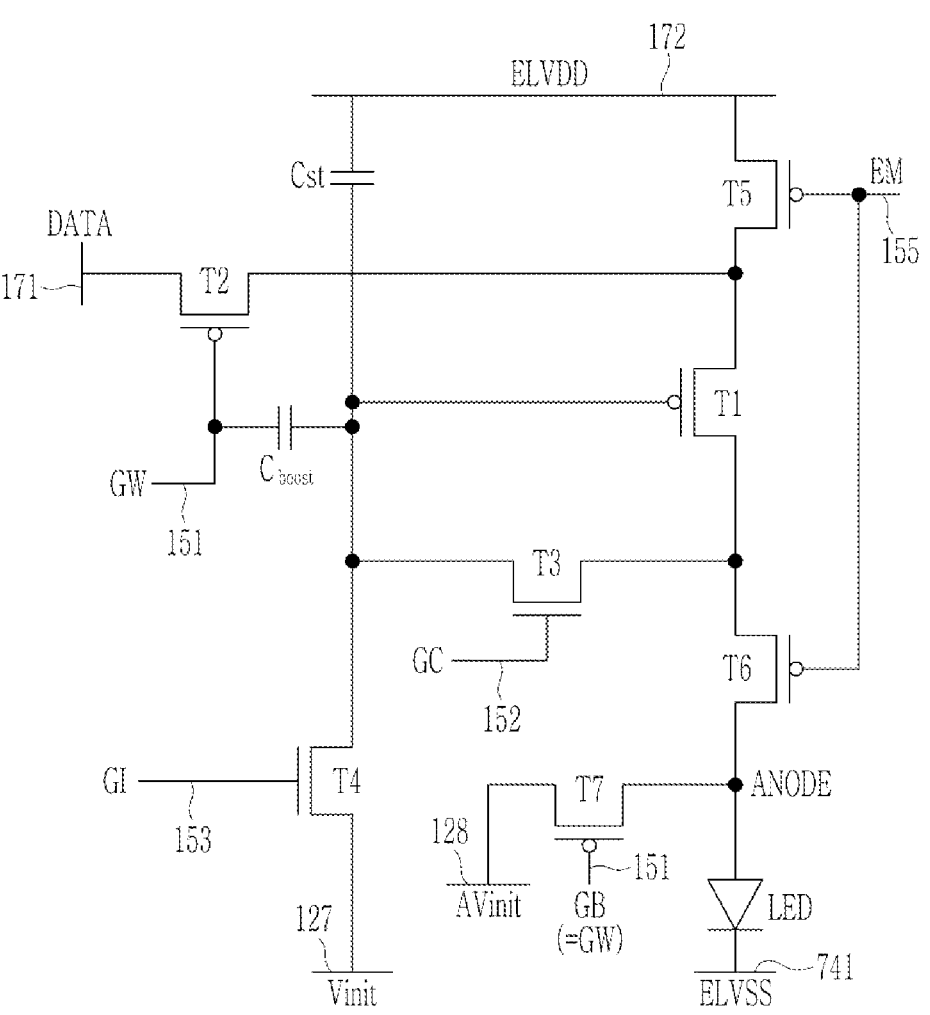
FIG. 6 is a schematic diagram of an equivalent circuit of a pixel included in a light emitting display device according to an embodiment.

FIG. 6 is a schematic diagram of an equivalent circuit of a pixel included in a light emitting display device according to an embodiment.

A pixel according to an embodiment may include transistors T1, T2, T3, T4, T5, T6, and T7, a storage capacitor Cst, a boost capacitor Cboost, and a light emitting diode LED, which are connected (e.g., electrically connected) to several wires (or lines) 127, 128, 151, 152, 153, 154, 155, 171, 172, and 741. For example, the transistors and the capacitors except for the light emitting diode LED may form the pixel circuit part. In another example, the boost capacitor Cboost may be omitted.

The wires (or lines) 127, 128, 151, 152, 153, 154, 155, 171, 172, and 741 may be connected (e.g., electrically connected) to the pixel PX. The wires (or lines) include a first initialization voltage line 127, a second initialization voltage line 128, a first scan line 151, a second scan line 152, an initialization control line 153, a bypass control line 154, a light emission control line 155, a data line 171, a driving voltage line 172, and a common voltage line 741.

The first scan line 151 may be connected (e.g., electrically connected) to a scan driver to transmit a first scan signal GW to the second transistor T2 and the seventh transistor T7. A voltage of an opposite polarity to the voltage applied to the first scan line 151 may be applied to the second scan line 152 at the same timing as the signal of the first scan line 151. In case that a negative voltage is applied to the first scan line 151, a positive voltage may be applied to the second scan line 152. The second scan line 152 may transmit a second scan signal GC to the third transistor T3. The initialization control line 153 may transmit an initialization control signal GI to the fourth transistor T4. The light emitting control line 155 may transmit a light emitting control signal EM to the fifth transistor T5 and the sixth transistor T6.

The data line 171 may be a wire that transmits a data voltage DATA generated by a data driver, and accordingly, the magnitude of the light emitting current transmitted to the light emitting diode LED may change, and thus the luminance of the light emitting diode LED may change. The driving voltage line 172 applies a driving voltage ELVDD. The first initialization voltage line 127 may transmit a first initialization voltage Vinit, and the second initialization voltage line 128 may transmit a second initialization voltage AVinit. The common voltage line 741 applies a common voltage ELVSS to the cathode CATHODE of the light emitting diode LED. In an embodiment, the voltages applied to the driving voltage line 172, the first and second initialization voltage lines 127 and 128, and the common voltage line 741 may be constant voltages, respectively.

The driving transistor T1 (e.g., a first transistor) may be a p-type transistor and may have a silicon semiconductor (e.g., a polycrystalline semiconductor) as a semiconductor layer. The driving transistor T1 may be a transistor that adjusts the magnitude of the light emitting current output to the anode ANODE of the light emitting diode LED according to the magnitude of the voltage of the gate electrode of the driving transistor T1 (e.g., the voltage stored in the storage capacitor Cst). As the brightness of the light emitting diode LED is adjusted according to the magnitude of the light emitting current output to the anode ANODE of the light emitting diode LED, the light emitting luminance of the light emitting diode LED may be adjusted according to the data voltage DATA applied to the pixel. For example, the first electrode of the driving transistor T1 may be disposed to receive the driving voltage ELVDD and may be connected (e.g., electrically connected) to the driving voltage line 172 via the fifth transistor T5. For example, the first electrode of the driving transistor T1 may be connected (e.g., electrically connected) to the second electrode of the second transistor T2 to receive the data voltage DATA. For example, the second electrode of the driving transistor T1 may output the light emitting current to the light emitting diode LED, and may be connected (e.g., electrically connected) to the anode ANODE of the light emitting diode LED via the sixth transistor T6 (hereinafter referred to as an output control transistor). For example, the second electrode of the driving transistor T1 may be connected (e.g., electrically connected) to the third transistor T3, and may transmit the data voltage DATA applied to the first electrode to the third transistor T3. For example, the gate electrode of the driving transistor T1 may be connected (e.g., electrically connected) to one electrode (hereinafter referred to as a second storage electrode) of the storage capacitor Cst. Accordingly, the voltage of the gate electrode of the driving transistor T1 may change according to the voltage stored in the storage capacitor Cst, and accordingly, the light emitting current output by the driving transistor T1 may be changed. The storage capacitor Cst may function to keep the voltage of the gate electrode of the driving transistor T1 constant for one frame. For example, the gate electrode of the driving transistor T1 may be connected (e.g., electrically connected) to the third transistor T3 so that the data voltage DATA applied to the first electrode of the driving transistor T1 may be transmitted to the gate electrode of the driving transistor T1 through the third transistor T3. For example, the gate electrode of the driving transistor T1 may be connected (e.g., electrically connected) to the fourth transistor T4 and may be initialized by receiving the first initialization voltage Vinit.

The second transistor T2 may be a p-type transistor and may have a silicon semiconductor as a semiconductor layer. The second transistor T2 may be a transistor that receives the data voltage DATA into the pixel. The gate electrode of the second transistor T2 may be connected (e.g., electrically connected) to the first scan line 151 and one electrode (hereinafter referred to as a lower boost electrode) of the boost capacitor Cboost. The first electrode of the second transistor T2 may be connected (e.g., electrically connected) to the data line 171. The second electrode of the second transistor T2 may be connected (e.g., electrically connected) to the first electrode of the driving transistor T1. In case that the second transistor T2 is turned on by a negative voltage among the first scan signals GW transmitted through the first scan line 151, the data voltage DATA transferred through the data line 171 may be transferred to the first electrode of the driving transistor T1, and finally the data voltage DATA may be transferred to the gate electrode of the driving transistor T1 and stored in the storage capacitor Cst.

The third transistor T3 may be an n-type transistor and may have an oxide semiconductor as a semiconductor layer. The third transistor T3 may connect (e.g., electrically connect) the second electrode of the driving transistor T1 and the gate electrode of the driving transistor T1. As a result, the third transistor T3 may be a transistor that transmits the data voltage DATA to be compensated by the threshold voltage of the driving transistor T1 and stored in the second storage electrode of the storage capacitor Cst. The gate electrode of the third transistor T3 may be connected (e.g., electrically connected) to the second scan line 152, and the first electrode of the third transistor T3 may be connected (e.g., electrically connected) to the second electrode of the driving transistor T1. The second electrode of the third transistor T3 may be connected (e.g., electrically connected) to the second storage electrode of the storage capacitor Cst, the gate electrode of the driving transistor T1, and the other electrode (hereinafter referred to as an upper boost electrode) of the boost capacitor Cboost. The third transistor T3 may be turned on by the positive voltage among the second scan signals GC received through the second scan line 152, thereby the gate electrode of the driving transistor T1 and the second electrode of the driving transistor T1 may be connected (e.g., electrically connected), and the voltage applied to the gate electrode of the driving transistor T1 may be transferred to the second storage electrode of the storage capacitor Cst and stored in the storage capacitor Cst. At this time, the voltage stored in the storage capacitor Cst may be stored in a state in which the voltage of the gate electrode of the driving transistor T1 in case that the driving transistor T1 is turned off is stored. Thus, the threshold voltage Vth of the driving transistor T1 may be compensated.

The fourth transistor T4 may be an n-type transistor and may have an oxide semiconductor as a semiconductor layer. The fourth transistor T4 may function to initialize the gate electrode of the driving transistor T1 and the second storage electrode of the storage capacitor Cst. The gate electrode of the fourth transistor T4 may be connected (e.g., electrically connected) to the initialization control line 153, and the first electrode of the fourth transistor T4 may be connected (e.g., electrically connected) to the first initialization voltage line 127. The second electrode of the fourth transistor T4 may be connected (e.g., electrically connected) to the second electrode of the third transistor T3, the second storage electrode of the storage capacitor Cst, the gate electrode of the driving transistor T1, and the upper boost electrode of the boost capacitor Cboost. The fourth transistor T4 may be turned on by the positive voltage of the initialization control signal GI received through the initialization control line 153. For example, the first initialization voltage Vinit may be transmitted to the gate electrode of the driving transistor T1, the second storage electrode of the storage capacitor Cst, and the upper boost electrode of the boost capacitor Cboost to be initialized.

The fifth transistor T5 and the sixth transistor T6 may be p-type transistors and have a silicon semiconductor as a semiconductor layer.

The fifth transistor T5 may function to transfer a driving voltage (ELVDD) to the driving transistor T1. The gate electrode of the fifth transistor T5 may be connected (e.g., electrically connected) to the light emitting control line 155, the first electrode of the fifth transistor T5 may be connected (e.g., electrically connected) to the driving voltage line 172, and the second electrode of the fifth transistor T5 may be connected (e.g., electrically connected) to the first electrode of the driving transistor T1.

The sixth transistor T6 may function to transmit the light emitting current output from the driving transistor T1 to the light emitting diode LED. The gate electrode of the sixth transistor T6 may be connected (e.g., electrically connected) to the light emitting control line 155, the first electrode of the sixth transistor T6 may be connected (e.g., electrically connected) to the second electrode of the driving transistor T1, and the second electrode of the sixth transistor T6 may be connected (e.g., electrically connected) to the anode ANODE of the light emitting diode LED.

The seventh transistor T7 may be a p-type or n-type transistor and may have a silicon semiconductor or an oxide semiconductor as a semiconductor layer, and in the embodiment in FIG. 6, the seventh transistor T7 as a p-type transistor may include a silicon semiconductor. The seventh transistor T7 may function to initialize the anode ANODE of the light emitting diode LED. The gate electrode of the seventh transistor T7 may be connected (e.g., electrically connected) to the first scan line 151, the first electrode of the seventh transistor T7 may be connected (e.g., electrically connected) to the anode ANODE of the light emitting diode LED, and the second electrode of the seventh transistor T7 may be connected (e.g., electrically connected) to the second initialization voltage line 128. For example, the gate electrode of the seventh transistor T7 may be connected (e.g., electrically connected) to the first scan line 151 of the previous pixel, and may not be connected (e.g., electrically connected) to the same first scan line 151 as the gate electrode of the second transistor T2 included in the same pixel PX, but may be connected (e.g., electrically connected) to the same first scan line 151 as the gate electrode of the second transistor T2 of the previous pixel PX. In case that the seventh transistor T7 is turned on by the negative voltage of the first scan line 151, the second initialization voltage AVinit may be applied to the anode ANODE of the light-emitting element to be initialized. For example, the gate electrode of the seventh transistor T7 may be connected (e.g., electrically connected) to a separate bypass control line and may be controlled by the first scan line 151 and separate wiring therefrom. For example, according to an embodiment, the second initialization voltage line 128 to which the second initialization voltage AVinit is applied and the first initialization voltage line 127 to which the first initialization voltage VINT is applied may be the same line.

Although it is described that one pixel PX includes seven transistors T1 to T7 and two capacitors (e.g., the storage capacitor Cst and the boost capacitor Cboost), embodiments are not limited thereto, and the boost capacitor Cboost may be excluded according to an embodiment. For example, in case that an embodiment in which the third transistor and the fourth transistor are formed of an n-type transistor, only one of them may be formed as an n-type transistor or the other transistor (e.g., the seventh transistor T7) may be formed as an n-type transistor.

In the above descriptions, the circuit structure of the pixel PX formed in the display area DA was examined through FIG. 6.

Hereinafter, the detailed planar structure and stacked structure of the pixel PX formed in the display area DA are described through FIG. 7 to FIG. 20, and the pixel PX of the following embodiment may include one sub-photosensor area.

FIG. 7 to FIG. 19 are schematic views showing a structure of each layer according to a manufacturing order of a lower panel layer LOW-PL among a light emitting display device according to an embodiment.

Figure 7:
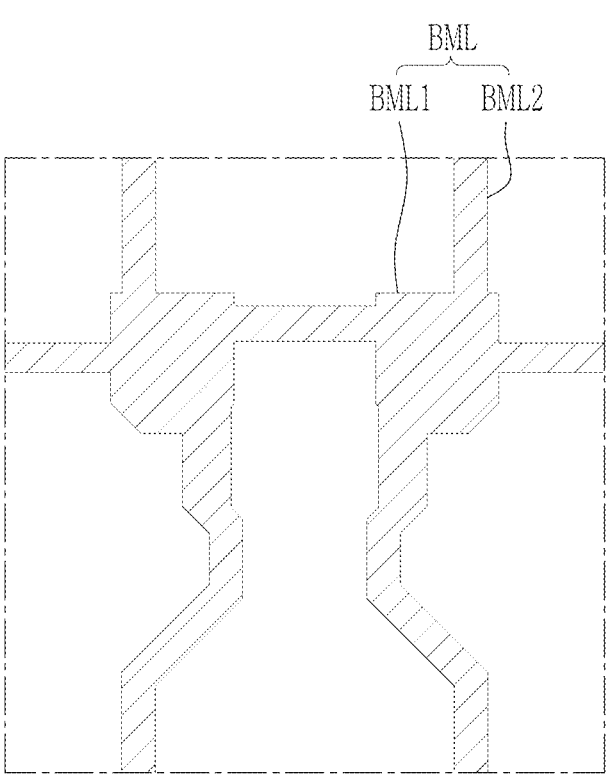
FIG. 7 to FIG. 19 are schematic views showing a structure of each layer according to a manufacturing sequence of a lower panel layer among a light emitting display device according to an embodiment.
Figure 7:
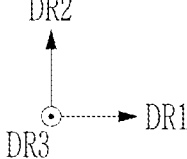

Referring to FIG. 7, a metal layer BML may be positioned on a substrate 110.

The substrate 110 may include a material that does not bend due to a rigid characteristic such as glass, or a flexible material that is bent such as plastic or polyimide. In the case of the flexible substrate, as shown in FIG. 20, it may have a double-layered structure of polyimide, and a barrier layer formed of an inorganic insulating material thereon may be formed double.

The metal layer BML may include expansion parts BML1 and a connection part BML2 connecting expansion parts BML1 to each other. The expansion part BML1 of the metal layer BML may be formed at a position overlapping with the channel 1132 of the driving transistor T1 in a plan view among the first semiconductor layer formed later. The metal layer BML may be a lower shielding layer, may include a metal or a metal alloy such as copper (Cu), molybdenum (Mo), aluminum (Al), titanium (Ti), etc., and may additionally include amorphous silicon and may be formed as a single layer or multiple layers.

Referring to FIG. 20, a buffer layer 111 covering the substrate 110 and the metal layer BML may be disposed on the substrate 110 and the metal layer BML. The buffer layer 111 may function to block penetration of impurity elements into the first semiconductor layer 130, and may be an inorganic insulating layer including a silicon oxide ($SiO_x$), a silicon nitride ($SiN_x$), a silicon oxynitride ($SiO_xN_y$), or the like.

Figure 8:
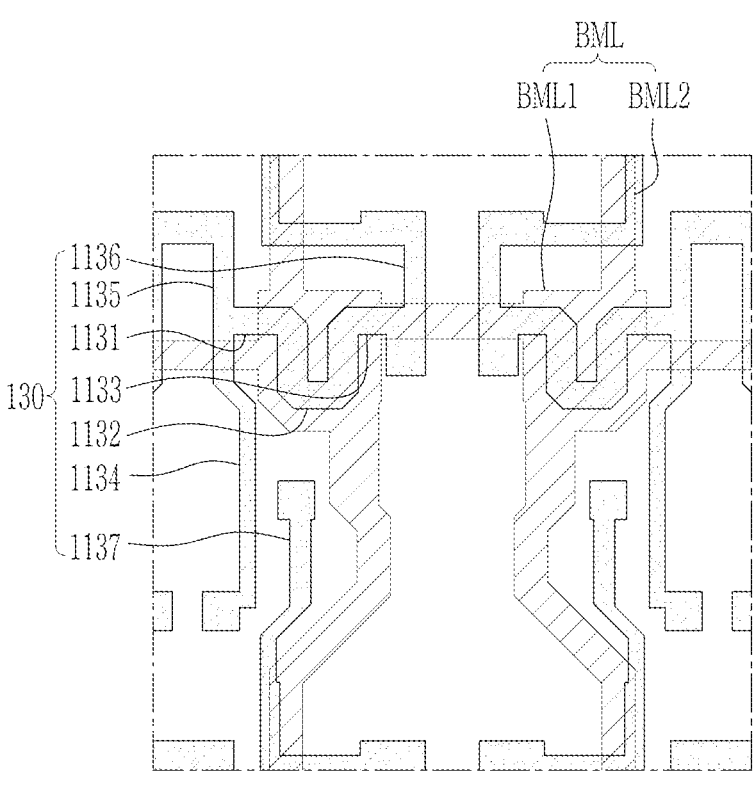
Figure 8:
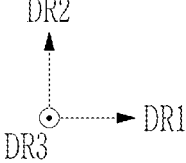

As shown in FIG. 8, a first semiconductor layer 130 formed of a silicon semiconductor (e.g., a polycrystalline semiconductor) may be positioned on the buffer layer 111. The first semiconductor layer 130 may include a channel 1132, a first area 1131, and a second area 1133 of the driving transistor T1. For example, the first semiconductor layer 130 may include channels of the second transistor T2, the fifth transistor T5, the sixth transistor T6, and the seventh transistor T7 as well as the driving transistor T1, and may have areas having a conductive layer characteristic by plasma processing or doping on sides (e.g., opposite sides) of each channel to function as the first and second electrodes.

The channel 1132 of the driving transistor T1 may have a curved shape of a "U" in a plan view. For example, the shape of channel 1132 of the driving transistor T1 may not be limited thereto, and may be variously changed. For example, the channel 1132 of the driving transistor T1 may be bent into various other shapes such as an S-shape, or may have a bar shape. The first area 1131 and the second area 1133 of the driving transistor T1 may be positioned on sides (e.g., opposite sides) of the channel 1132 of the driving transistor T1. The first area 1131 and the second area 1133 positioned in the first semiconductor layer may function as the first electrode and the second electrode of the driving transistor T1.

A channel, a first area, and a second area of the second transistor T2 may be positioned in the portion 1134 extending downward from the first area 1131 of the driving transistor T1 in the first semiconductor layer 130. A channel, a first area, and a second area of the fifth transistor T5 may be positioned in the portion 1135 extending upward from the first area 1131 of the driving transistor T1. A channel, a first area, and a second area of the sixth transistor T6 may be positioned in a portion 1136 extending upward from the second area 1133 of the driving transistor T1. A channel, a first area, and a second area of the seventh transistor T7 may be positioned in a portion 1137 further extending upward with bending from the portion 1136 of the first semiconductor layer 130.

Referring to FIG. 20, a first gate insulating layer 141 may be positioned on the first semiconductor layer 130 including the channel 1132, the first area 1131, and the second area 1133 of the driving transistor T1. The first gate insulating layer 141 may be an inorganic insulating layer including a silicon oxide ($SiO_x$), a silicon nitride ($SiN_x$), a silicon oxynitride ($SiO_xN_y$), or the like.

Figure 9:
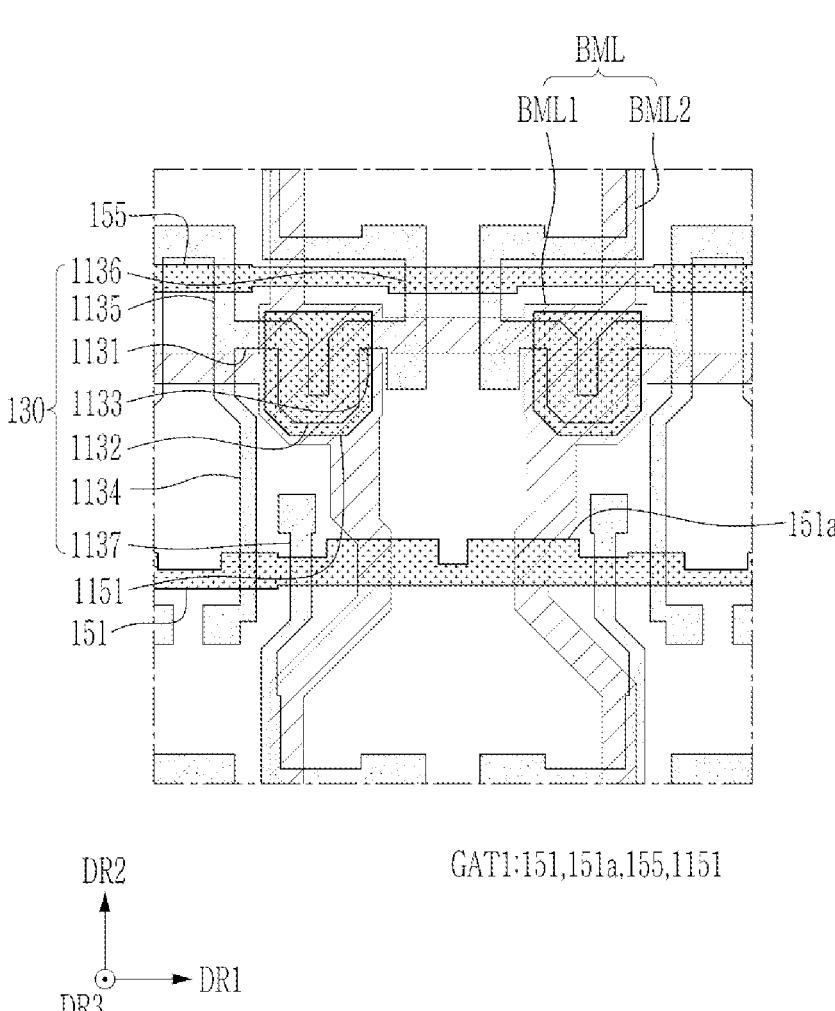

Referring to FIG. 9, a first gate conductive layer GAT1 including a gate electrode 1151 of the driving transistor T1 may be positioned on the first gate insulating layer 141. The first gate conductive layer GAT1 may include a gate electrode of each of the second transistor T2, the fifth transistor T5, the sixth transistor T6, and the seventh transistor T7 as well as the driving transistor T1. The gate electrode 1151 of the driving transistor T1 may overlap the channel 1132 of the driving transistor T1. The channel 1132 of the driving transistor T1 may be covered by the gate electrode 1151 of the driving transistor T1.

The first gate conductive layer GAT1 may further include a first scan line 151 and a light emission control line 155. The first scan line 151 and the light emission control line 155 may substantially extend in a horizontal direction (hereinafter referred to as a first direction). The first scan line 151 may be connected (e.g., electrically connected) to the gate electrode of the second transistor T2, and the first scan line 151 may be integral with the gate electrode of the second transistor T2. The first scan line 151 may be connected (e.g., electrically connected) to or integrated with the gate electrode of the seventh transistor T7 of the pixel of the next stage. The first scan line 151 may include a lower boost electrode 151a having an extended width, and may overlap an upper boost electrode 3138t to be described below to form a boost capacitor Cboost.

For example, the light emitting control line 155 may be connected (e.g., electrically connected) to the gate electrode of the fifth transistor T5 and the gate electrode of the sixth transistor T6, and the light emitting control line 155 and the gate electrode of the fifth transistor T5 and the sixth transistor T6 may be integral with each other.

The first gate conductive layer GAT1 may include a metal such as copper (Cu), molybdenum (Mo), aluminum (Al), titanium (Ti), or a metal alloy, and may be formed as a single layer or multiple layers.

After the first gate conductive layer GAT1 including the gate electrode 1151 of the driving transistor T1 is formed, a plasma treatment or a doping process may be performed to make the exposed portion of the first semiconductor layer that is not covered by the first gate conductive layer GAT1 conductive. For example, the first semiconductor layer covered by the first gate conductive layer GAT1 may not be conductive, and the portion of the first semiconductor layer not covered by the first gate conductive layer GAT1 may have the same characteristic as the conductive layer. As a result, the transistor including the conductive portion may have a p-type transistor characteristic, and the driving transistor T1, the second transistor T2, the fifth transistor T5, the sixth transistor T6, and the seventh transistor T7 may be p-type transistors.

Figure 22:
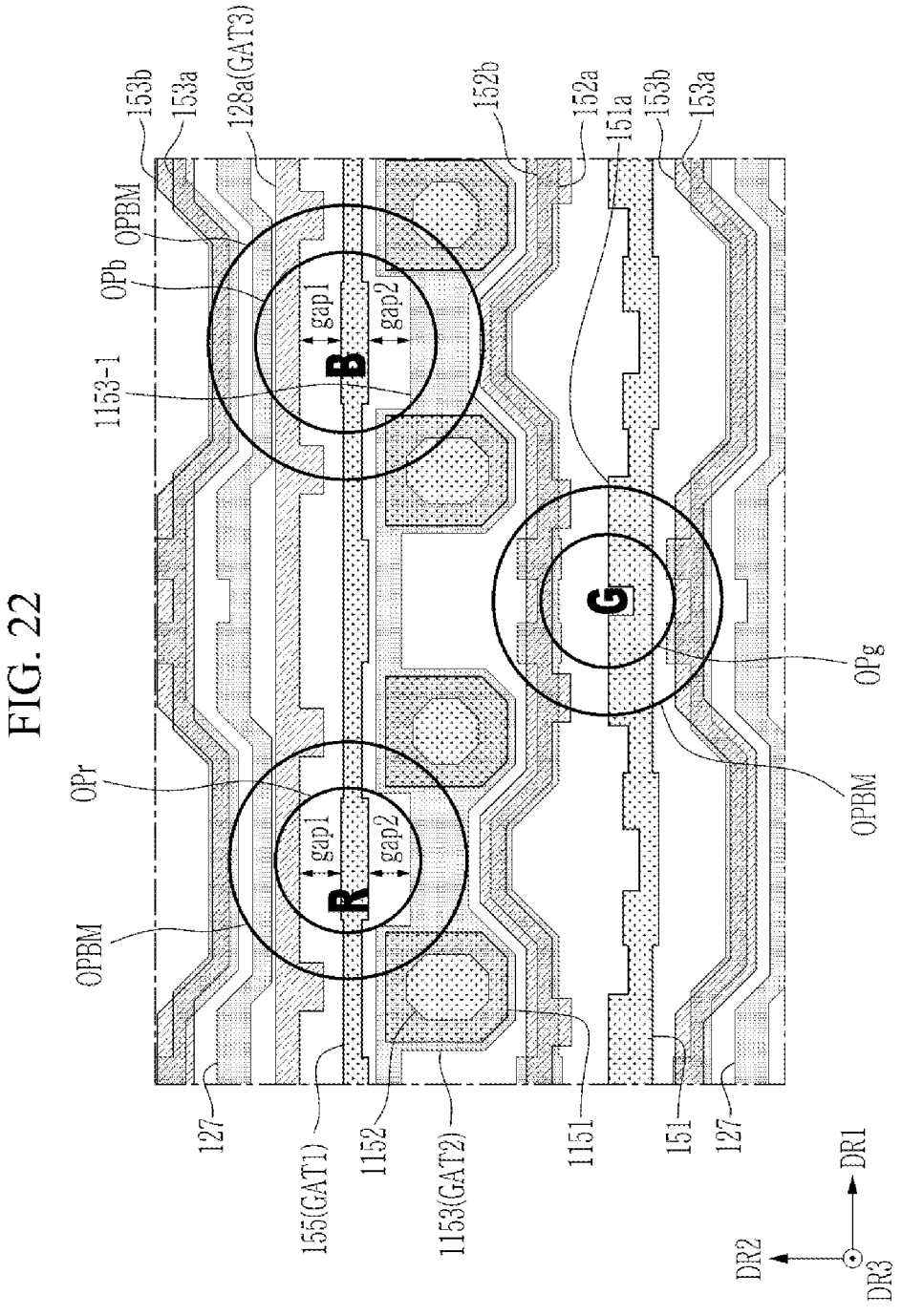
FIG. 22 is a schematic top plan view showing an opening of a pixel definition layer together with a first gate conductive layer, a second gate conductive layer, and a third gate conductive layer according to an embodiment.

Referring to FIG. 22, a second gate insulating layer 142 may be positioned on the first gate conductive layer GAT1 including the gate electrode 1151 of the driving transistor T1 and the first gate insulating layer 141. The second gate insulating layer 142 may be an inorganic insulating layer including a silicon oxide ($SiO_x$), a silicon nitride ($SiN_x$), a silicon oxynitride ($SiO_xN_y$), or the like.

Figure 10:
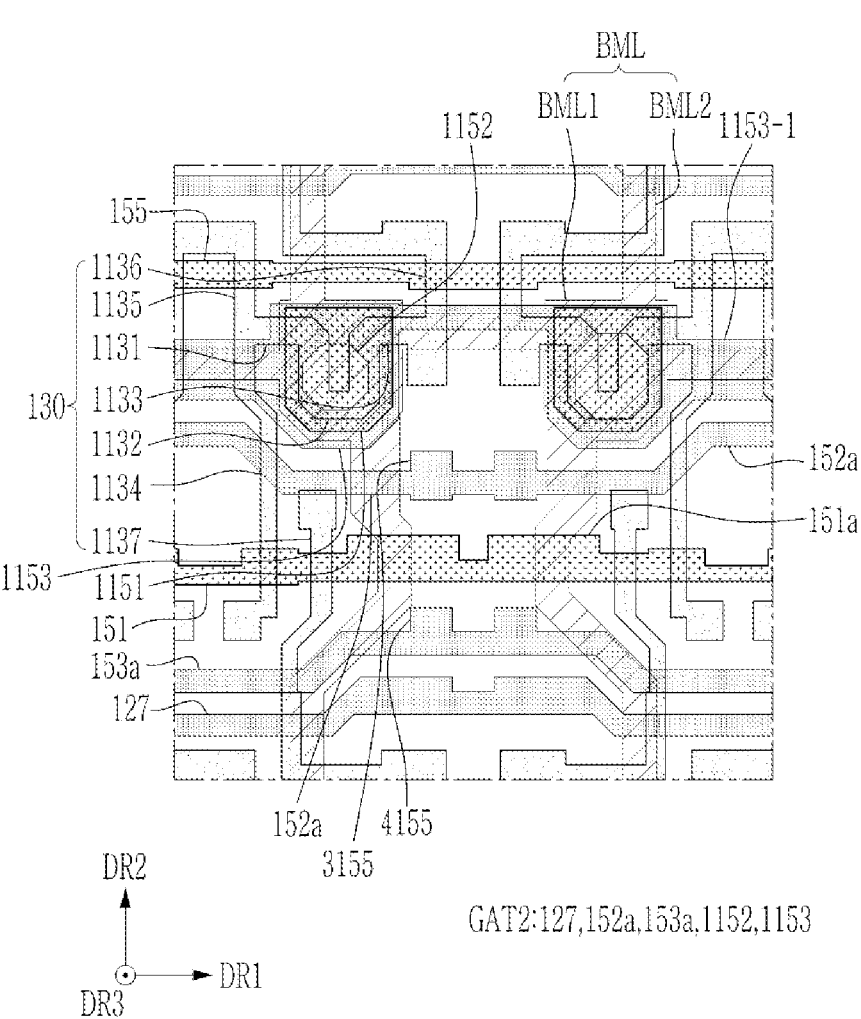

Referring to FIG. 10, a second gate conductive layer GAT2 including a first storage electrode 1153 of a storage capacitor Cst, a lower shielding layer 3155 of a third transistor T3, and a lower shielding layer 4155 of a fourth transistor T4 may be positioned on the second gate insulating layer 142. The lower shielding layers 3155 and 4155 may be positioned below the channels of the third transistor T3 and the fourth transistor T4, respectively, and may function to shield from optical or electromagnetic interference provided to the channel from the lower side.

The first storage electrode 1153 may overlap the gate electrode 1151 of the driving transistor T1 to form a storage capacitor Cst. An opening 1152 may be formed in the first storage electrode 1153 of the storage capacitor Cst. The opening 1152 of the first storage electrode 1153 of the storage capacitor Cst may overlap the gate electrode 1151 of the driving transistor T1. The first storage electrode 1153 may include a connection part 1153-1 extending in a horizontal direction (e.g., the first direction) to connect the adjacent first storage electrodes 1153 to each other. The connection part 1153-1 of the first storage electrode 1153 may be positioned to have an upper side separated by a distance from the upper side of the first storage electrode 1153. By forming the connection part 1153-1 of the first storage electrode 1153 in this way, as shown in FIG. 22, an interval (or distance) gap1 and an interval (or distance) gap2 may have the same interval (or the same distance) in a plan view.

The lower shielding layer 3155 of the third transistor T3 may overlap the channel 3137 and the gate electrode 3151 of the third transistor T3. The lower shielding layer 4155 of the fourth transistor T4 may overlap the channel 4137 and the gate electrode 4151 of the fourth transistor T4.

The second gate conductive layer GAT2 may further include a lower second scan line 152a, a lower initialization control line 153a, and a first initialization voltage line 127. The lower second scan line 152a, the lower initialization control line 153a, and the first initialization voltage line 127 may substantially extend in the horizontal direction (e.g., the first direction). The lower second scan line 152a may be connected (e.g., electrically connected) to the lower shielding layer 3155 of the third transistor T3. The lower initialization control line 153a may be connected (e.g., electrically connected) to the lower shielding layer 4155 of the fourth transistor T4.

The second gate conductive layer GAT2 may include a metal or a metal alloy such as copper (Cu), molybdenum (Mo), aluminum (Al), or titanium (Ti), and may be formed of a single layer or multiple layers.

Referring to FIG. 20, a first interlayer insulating layer 161 may be positioned on the second gate conductive layer GAT2 including the first storage electrode 1153 of the storage capacitor Cst, the lower shielding layer 3155 of the third transistor T3, and the lower shielding layer 4155 of the fourth transistor T4. The first interlayer insulating layer 161 may include an inorganic insulating layer including a silicon oxide ($SiO_x$), a silicon nitride ($SiN_x$), a silicon oxynitride ($SiO_xN_y$), and the like, and an inorganic insulating material may be thickly formed according to an embodiment.

Figure 11:
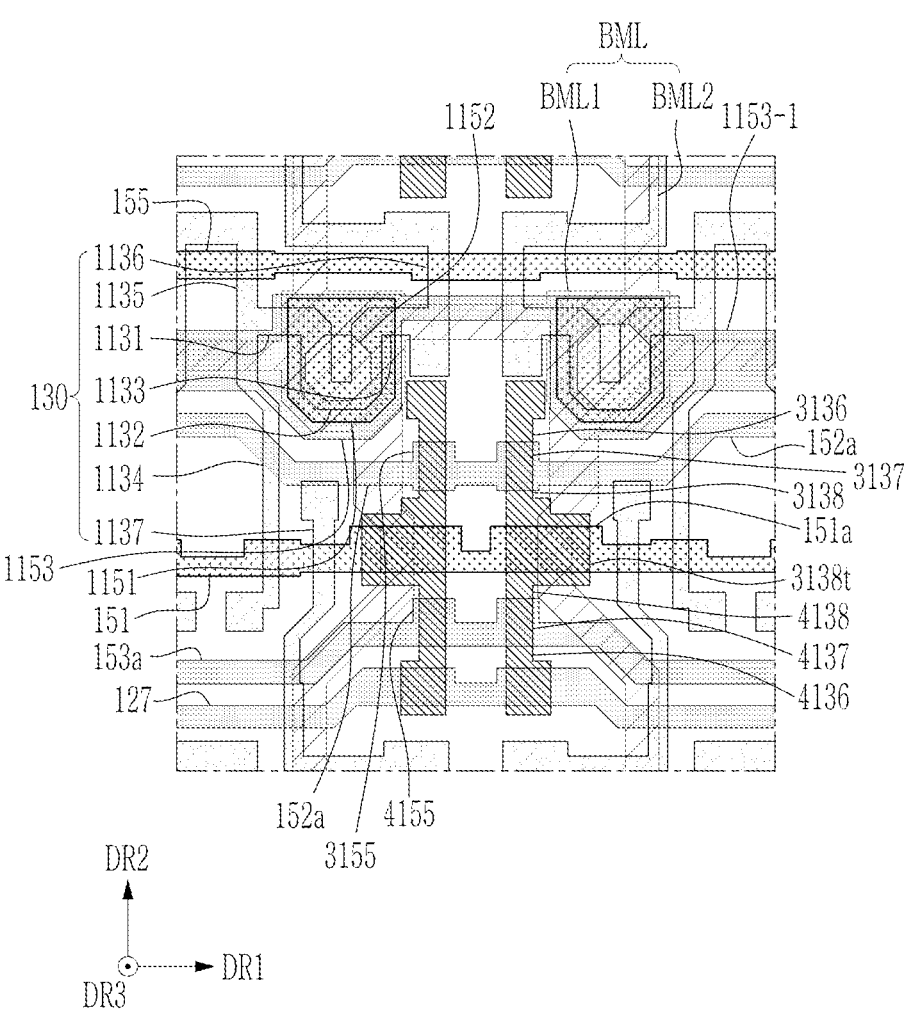

Referring to FIG. 11, an oxide semiconductor layer including a channel 3137, a first area 3136, and a second area 3138 of the third transistor T3, and a channel 4137, a first area 4136, and a second area 4138 of the fourth transistor T4, may be positioned on the first interlayer insulating layer 161. For example, the oxide semiconductor layer may include an upper boost electrode 3138t of the capacitor Cboost.

The channel 3137, the first area 3136, and the second area 3138 of the third transistor T3, and the channel 4137, the first area 4136, and the second area 4138 of the fourth transistor T4, may be connected (e.g., electrically connected) to each other to form an integral body. The first area 3136 and the second area 3138 of the third transistor T3 may be positioned on sides (e.g., opposite sides) of the channel 3137 of the third transistor T3, and the first area 4136 and the second area 4138 of the fourth transistor T4 may be positioned on sides (e.g., opposite sides) of the channel 4137 of the fourth transistor T4. The second area 3138 of the third transistor T3 may be connected (e.g., electrically connected) to the second area 4138 of the fourth transistor T4. The channel 3137 of the third transistor T3 may overlap the lower shielding layer 3155, and the channel 4137 of the fourth transistor T4 may overlap the lower shielding layer 4155.

The upper boost electrode 3138*t* of the capacitor Cboost with an extended width may be positioned between the second area 3138 of the third transistor T3 and the second area 4138 of the fourth transistor T4. The upper boost electrode 3138*t* of the boost capacitor Cboost may overlap the lower boost electrode 151*a* of the boost capacitor Cboost positioned in the first gate conductive layer GAT1 to form the boost capacitor Cboost.

Referring to FIG. 20, a third gate insulating layer 143 may be positioned on the oxide semiconductor layer including the channel 3137, the first area 3136, and the second area 3138 of the third transistor T3, the channel 4137, the first area 4136, and the second area 4138 of the fourth transistor T4, and the upper boost electrode 3138*t* of the boost capacitor Cboost.

The third gate insulating layer 143 may be positioned on the surface (e.g., the entire surface) on the oxide semiconductor layer and the first interlayer insulating layer 161. Accordingly, the third gate insulating layer 143 may cover the upper surface and the side of the channel 3137, the first area 3136 and the second area 3138 of the third transistor T3, the channel 4137, the first area 4136, and the second area 4138 of the fourth transistor T4, and the upper boost electrode 3138*t* of the boost capacitor Cboost. For example, embodiments are not limited thereto, and the third gate insulating layer 143 may not be positioned on the entire surface of the oxide semiconductor layer and the first interlayer insulating layer 161. For example, the third gate insulating layer 143 may overlap the channel 3137 of the third transistor T3 and may not overlap the first area 3136 and the second area 3138. For example, the third gate insulating layer 143 may overlap the channel 4137 of the fourth transistor T4 and may not overlap the first area 4136 and the second area 4138.

The third gate insulating layer 143 may include an inorganic insulating layer including a silicon oxide ($SiO_x$), a silicon nitride ($SiN_x$), a silicon oxynitride ($SiO_xN_y$), or the like.

Figure 12:
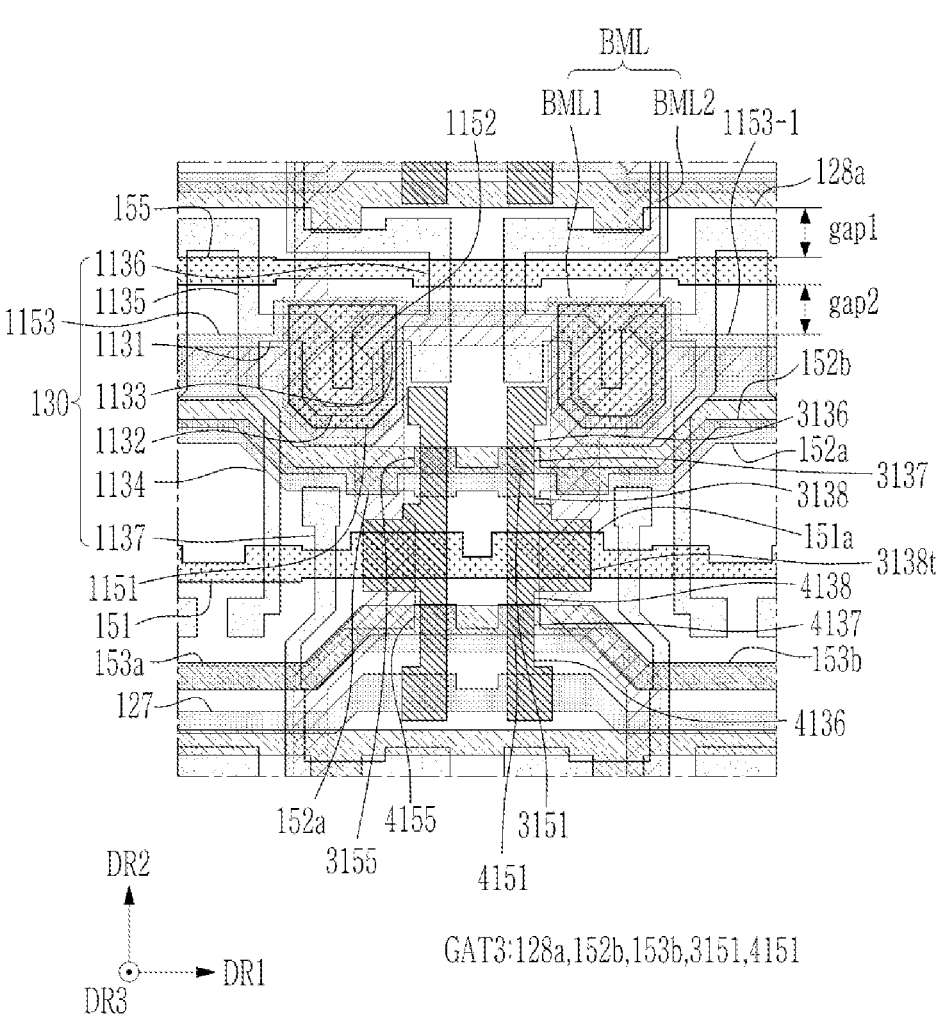

Referring to FIG. 12, a third gate conductive layer GAT3 including a gate electrode 3151 of the third transistor T3 and a gate electrode 4151 of the fourth transistor T4 may be positioned on the third gate insulating layer 143.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The third gate conductive layer GAT3 may further include an upper second scan line 152*b* and an upper initialization control line 153*b*.

The upper second scan line 152*b* and the upper initialization control line 153*b* may substantially extend in the horizontal direction (e.g., the first direction). The upper second scan line 152*b* may include the gate electrode 3151 of the third transistor T3 and may form the second scan line 152 together with the lower second scan line 152*a*. The upper initialization control line 153*b* may include the gate electrode 4151 of the fourth transistor T4 and may form the initialization control line 153 together with the lower initialization control line 153*a*.

For example, the third gate conductive layer GAT3 may further include a lower second initialization voltage line 128*a*. The lower second initialization voltage line 128*a* may substantially extend in a horizontal direction (e.g., the first direction), and a second initialization voltage AVinit may be applied.

Referring to the embodiment of FIG. 12, based on the light emitting control line 155 of the first gate conductive layer GAT1 in a plan view, an interval (or distance) gap1 up to the lower second initialization voltage line 128*a* of the third gate conductive layer GAT3 and an interval (or distance) gap2 up to the connection part 1153-1 of the first storage electrode 1153 of the second gate conductive layer GAT2 may be substantially the same in a plan view. For example, the interval (or distance) gap2 may be the interval from the extension part of the light emitting control line 155 to the connection part 1153-1 of the first storage electrode 1153, but according to an embodiment, the interval (or distance) gap2 may be an interval (or distance) up to the connection part 1153-1 of the first storage electrode 1153 from the portion that is not the extension part of the light emitting control line 155.

As described above, the portion in which two intervals (or distances) gap1 and gap2 are constant may overlap, in a plan view, the expansion part FL-SD1 (hereinafter referred to as a first extension part) and/or the anode ANODE positioned in the first data conductive layer SD1 to be described below. For example, the portion, in which two intervals (or distances) gap1 and gap2 are constant, may overlap openings OPr and OPb of the red or blue among the openings formed in the pixel definition layer 380 in a plan view. For example, the center portion of the red or blue openings OPr and OPb of the pixel definition layer 380 may be positioned on the light emitting control line 155, which is the center portion of two intervals (or distances) gap1 and gap2 in a plan view. For example, the upper boundary among the red or blue openings OPr and OPb of the pixel definition layer 380 may overlap the second initialization voltage line 128*a* in a plan view, and the lower boundary among the openings OPr, OPg, and OPb of the pixel definition layer 380 may overlap the first storage electrode 1153 in a plan view.

As described above, in the red or blue openings OPr and OPb of the pixel definition layer 380 and/or the anode ANODE, as three wires positioned thereunder have substantially the same intervals (or the same distances) gap1 and gap2, the anode ANODE of the red or blue light emitting diode LED may be flatter. As a result, the display quality may be improved or enhanced by preventing the light reflected from the anode ANODE from spreading asymmetrically by reducing the reflected color band caused by a color spread (e.g., a color separation) due to the reflected light.

The third gate conductive layer GAT3 may include a metal or a metal alloy such as copper (Cu), molybdenum (Mo), aluminum (Al), or titanium (Ti), and may be composed of a single layer or multiple layers.

After forming the third gate conductive layer GAT3 including the gate electrode 3151 of the third transistor T3 and the gate electrode 4151 of the fourth transistor T4, the portion of the oxide semiconductor layer covered by the third gate conductive layer GAT3 may be formed into the channel through a plasma treatment or a doping process, and the portion of the oxide semiconductor layer not covered by the third gate conductive layer GAT3 may be conductive. The channel 3137 of the third transistor T3 may be positioned under the gate electrode 3151 to overlap the gate electrode 3151. The first area 3136 and the second area 3138 of the third transistor T3 may not overlap the gate electrode 3151. The channel 4137 of the fourth transistor T4 may be positioned under the gate electrode 4151 to overlap the gate electrode 4151. The first area 3136 and the second area 3138 of the third transistor T3 may not overlap the gate electrode 3151. The upper boost electrode 3138*t* may not overlap the third gate conductive layer GAT3. A transistor including an oxide semiconductor layer may have characteristics of an n-type transistor.

Referring to FIG. 20, a second interlayer insulating layer 162 may be positioned on the third gate conductive layer GAT3 including the gate electrode 3151 of the third transistor T3 and the gate electrode 4151 of the fourth transistor T4. The second interlayer insulating layer 162 may have a single-layered structure or a multi-layered structure. The second interlayer insulating layer 162 may include an inorganic insulating material such as a silicon nitride ($SiN_x$), a silicon oxide ($SiO_x$), or a silicon oxynitride ($SiO_xN_y$), and may include an organic material according to an embodiment.

Figure 13:
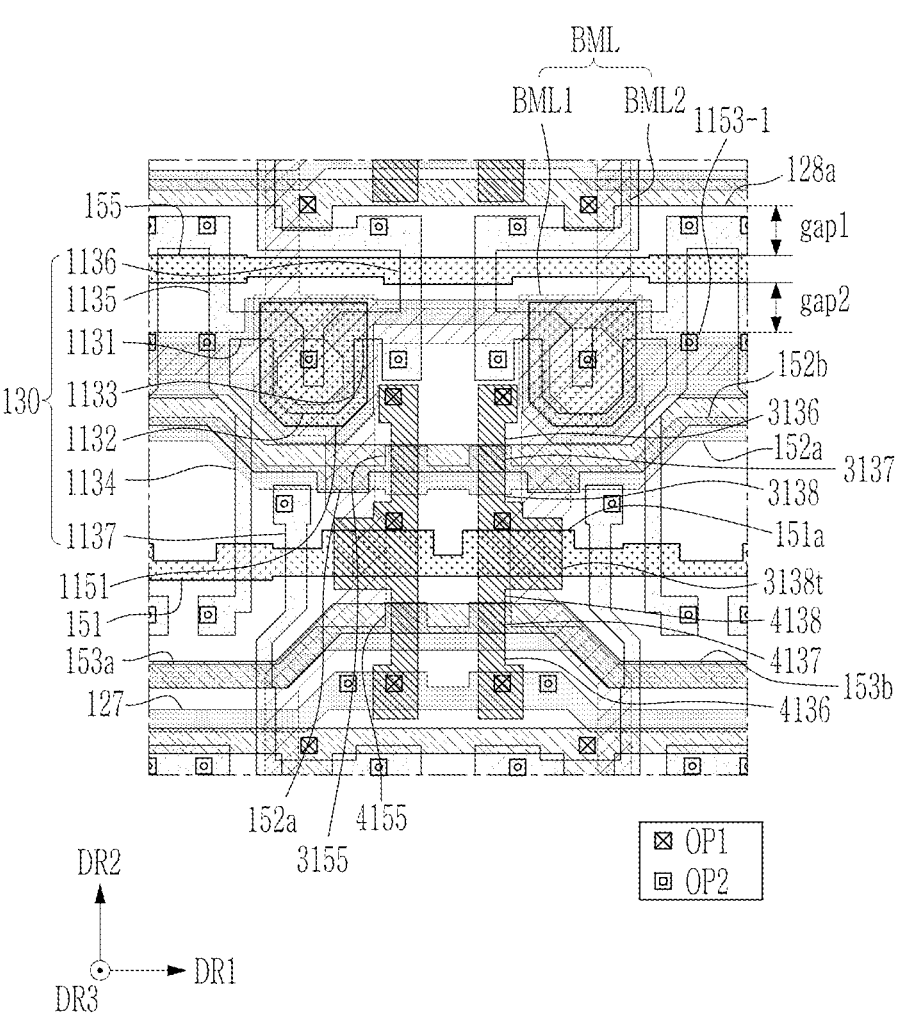

Referring to FIG. 13, two types of openings OP1 and OP2 may be formed in the second interlayer insulating layer 162. The two types of openings OP1 and OP2 may be formed by using different masks.

The opening OP1 may be an opening formed in at least one of the second interlayer insulating layer 162, the third gate insulating layer 143, the first interlayer insulating layer 161, the second gate insulating layer 142, and the first gate insulating layer 141, and may expose the first semiconductor layer 130, the first gate conductive layer GAT1, or the second gate conductive layer GAT2.

The opening OP2 may be an opening formed in the second interlayer insulating layer 162 and/or the third gate insulating layer 143, and may expose the oxide semiconductor layer or the third gate conductive layer GAT3.

One of the openings OP1 may overlap at least a portion of the gate electrode 1151 of the driving transistor T1, and may be formed in the third gate insulating layer 143, the first interlayer insulating layer 161, and the second gate insulating layer 142. For example, one of the openings OP1 may overlap the opening 1152 of the first storage electrode 1153, and may be positioned inside the opening 1152 of the first storage electrode 1153.

One of the openings OP2 may overlap at least a portion of the boost capacitor Cboost, and may be further formed in the third gate insulating layer 143.

Another one of the openings OP1 may overlap at least a part of the second area 1133 of the driving transistor T1, and the third opening 3165 may be formed in the third gate insulating layer 143, the first interlayer insulating layer 161, the second gate insulating layer 142, and the first gate insulating layer 141.

Another one of the openings OP2 may overlap at least a part of the first area 3136 of the third transistor T3 and may be formed in the third gate insulating layer 143.

Figure 14:
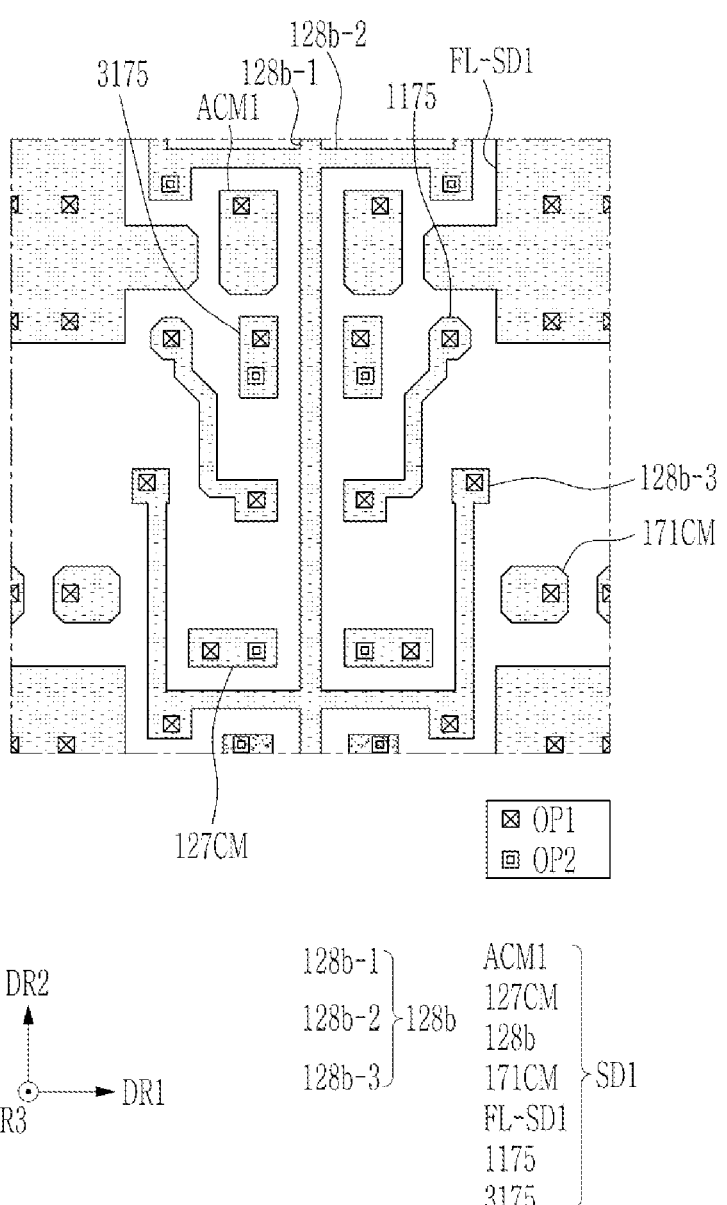
Figure 15:
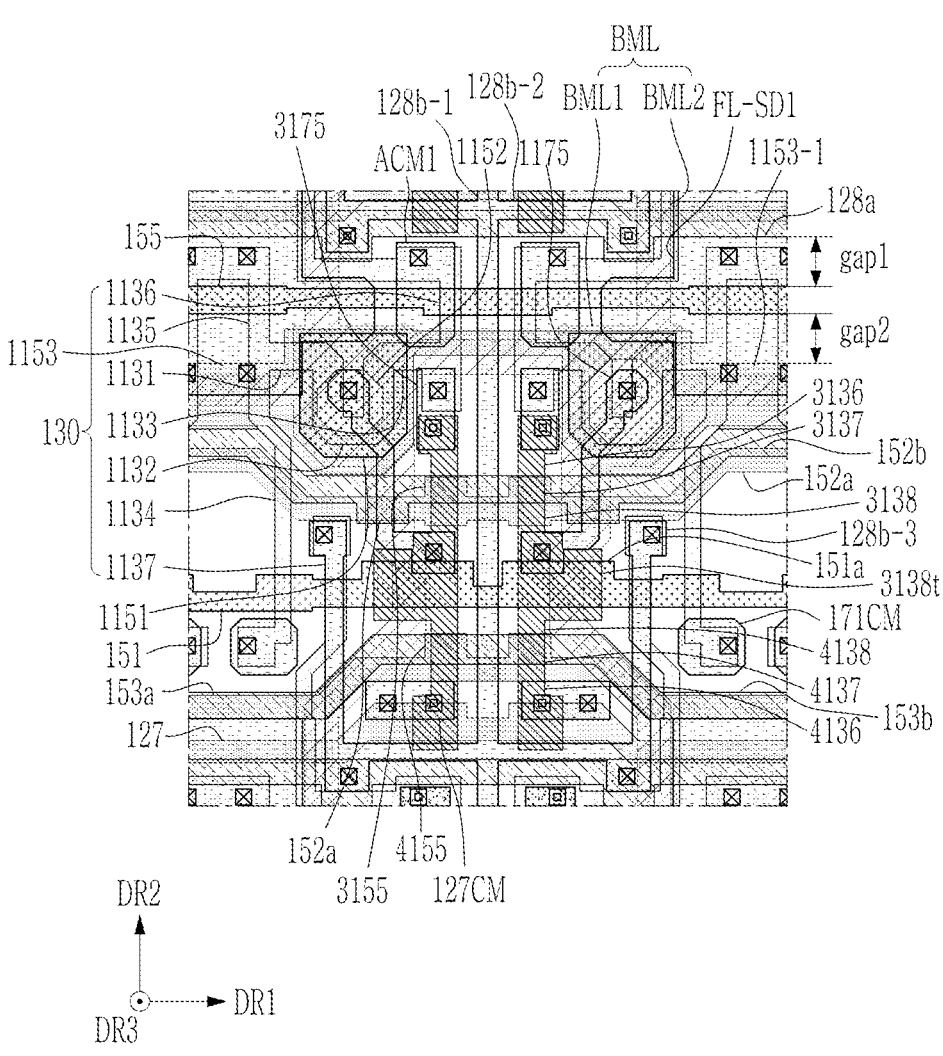

Referring to FIG. 14 and FIG. 15, a first data conductive layer SD1 including a first connection electrode 1175 and a second connection electrode 3175 may be positioned on the second interlayer insulating layer 162. FIG. 14 is a schematic top plan view showing only the first data conductive layer SD1, the opening OP1, and the opening OP2 as it is difficult to readily recognize the first data conductive layer SD1 in FIG. 15. FIG. 15 is a schematic top plan view showing all layers below the first data conductive layer SD1.

The first connection electrode 1175 may overlap the gate electrode 1151 of the driving transistor T1. The first connection electrode 1175 may be connected (e.g., electrically connected) to the gate electrode 1151 of the driving transistor T1 through the opening OP1 and the opening 1152 of the first storage electrode 1153. The first connection electrode 1175 may overlap the boost capacitor Cboost. The first connection electrode 1175 may be connected (e.g., electrically connected) to the upper boost electrode 3138*t* of the boost capacitor Cboost through the opening OP2. Accordingly, the gate electrode 1151 of the driving transistor T1 and the upper boost electrode 3138*t* of the boost capacitor Cboost may be connected (e.g., electrically connected) by the first connection electrode 1175. For example, the gate electrode 1151 of the driving transistor T1 may be connected (e.g., electrically connected) to the second area 3138 of the third transistor T3 and the second area 4138 of the fourth transistor T4 by the first connection electrode 1175.

The second connection electrode 3175 may overlap the second area 1133 of the driving transistor T1. The second connection electrode 3175 may be connected (e.g., electrically connected) to the second area 1133 of the driving transistor T1 through the opening OP1. The second connection electrode 3175 may overlap the first area 3136 of the third transistor T3. The second connection electrode 3175 may be connected (e.g., electrically connected) to the first area 3136 of the third transistor T3 through the opening OP2. Accordingly, the second area 1133 of the driving transistor T1 and the first area 3136 of the third transistor T3 may be connected (e.g., electrically connected) by the second connection electrode 3175.

The first data conductive layer SD1 may further include a second initialization voltage line 128*b*. The second initialization voltage line 128*b* may include a wiring part 128*b*-1 extending in the vertical direction (e.g., the second direction) and a first extension 128*b*-2 protruded in sides (e.g., opposite sides) of the horizontal direction (e.g., the first direction) from the wiring part 128*b*-1, and may include a second extension part 128*b*-3 positioned with again bending in the vertical direction (e.g., the second direction) from the first extension 128*b*-2. In the portion where the first extension 128*b*-2 and the second extension part 128*b*-3 meet, the second initialization voltage line 128*b* may be connected (e.g., electrically connected) to the second initialization voltage line 128*a* of the third gate conductive layer GAT3 through the opening OP2. As a result, the second initialization voltage AVinit may be transmitted in the horizontal direction (e.g., the first direction) through the second initialization voltage line 128*a* positioned in the third gate conductive layer GAT3 and transmitted in the vertical direction (e.g., the second direction) through the second initialization voltage line 128*b* in the first data conductive layer SD1.

The end portion of the second extension part 128*b*-3 may be connected (e.g., electrically connected) to one portion 1137 of the first semiconductor layer 130 through the opening OP1, and the second initialization voltage AVinit may be transmitted to the seventh transistor T7.

The first data conductive layer SD1 may further include connection parts 127CM and 171CM, an anode connecting electrode ACM1, and an expansion part FL-SD1.

The connection part 127CM may be connected (e.g., electrically connected) to the first initialization voltage line 127 of the second gate conductive layer GAT2 through the opening OP1, and may be connected (e.g., electrically connected) to the first area 4136 of the second semiconductor layer (e.g., the oxide semiconductor layer) through the opening OP2 to transmit the first initialization voltage Vinit flowing through the first initialization voltage line 127 to the fourth transistor T4 of the oxide semiconductor layer.

The connection part 171CM may be connected (e.g., electrically connected) to one portion 1134 of the first semiconductor layer 130, e.g., the second transistor T2, through the opening OP1.

The anode connecting electrode ACM1 may be connected (e.g., electrically connected) to one portion 1136 of the first semiconductor layer 130, e.g., the sixth transistor T6, through the opening OP1.

The expansion part FL-SD1 may be widely formed in order to planarize the anode ANODE included in the red and blue light emitting diode LED. For example, the expansion part FL-SD1 may be connected (e.g., electrically connected) to a portion 1135 of the first semiconductor layer 130 through the opening OP1, e.g., the fifth transistor T5, and may be connected (e.g., electrically connected) to the first storage electrode 1153 through the opening OP1. The expansion part FL-SD1 of the first data conductive layer SD1 may overlap the anode ANODE of the red or blue light emitting diode LED in a plan view, and may be called an extension part for flattening the anode ANODE for the red or blue light emitting diode LED.

Referring to the embodiment of FIG. 15 and FIG. 22, in a plan view, the interval (or distance) gap1 up to the lower second initialization voltage line 128a of the third gate conductive layer GAT3 from the light emitting control line 155 of the first gate conductive layer GAT1 and the interval (or distance) gap2 from the light emitting control line 155 of the first gate conductive layer GAT1 to the connection part 1153-1 of the first storage electrode 1153 of the second gate conductive layer GAT2 may be substantially the same in a plan view. The light emitting control line 155, the lower second initialization voltage line 128a, and the connection part 1153-1 of the first storage electrode 1153 as the portion of which two intervals (or two distances) gap1 and gap2 are constant may overlap the expansion part FL-SD1 of the first data conductive layer SD1 in a plan view. For example, the portion in which two intervals (or two distances) gap1 and gap2 are constant may overlap the anode ANODE included in the red and blue light emitting diodes LED to be described below and/or the openings OPr and OPb of the pixel definition layer 380 corresponding to the red and blue light emitting diodes (LED).

The first data conductive layer SD1 may include a metal such as aluminum (Al), copper (Cu), molybdenum (Mo), titanium (Ti), or a metal alloy thereof, and may be formed as a single layer or multiple layers.

Referring to FIG. 20, a first organic layer 181 may be positioned on the first data conductive layer SD1 including the first connection electrode 1175 and the second connection electrode 3175. The first organic layer 181 may be an organic insulator including an organic material, and the organic material may include at least one material selected from a group of polyimide, polyamide, acryl resin, benzocyclobutene, and phenol resin.

Figure 16:
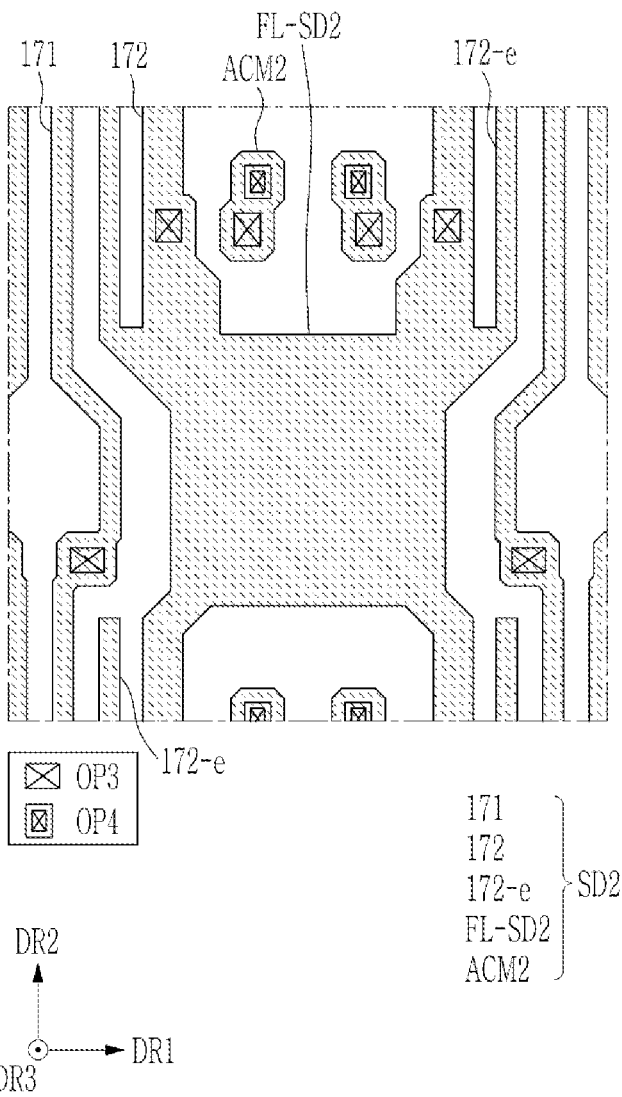
Figure 17:
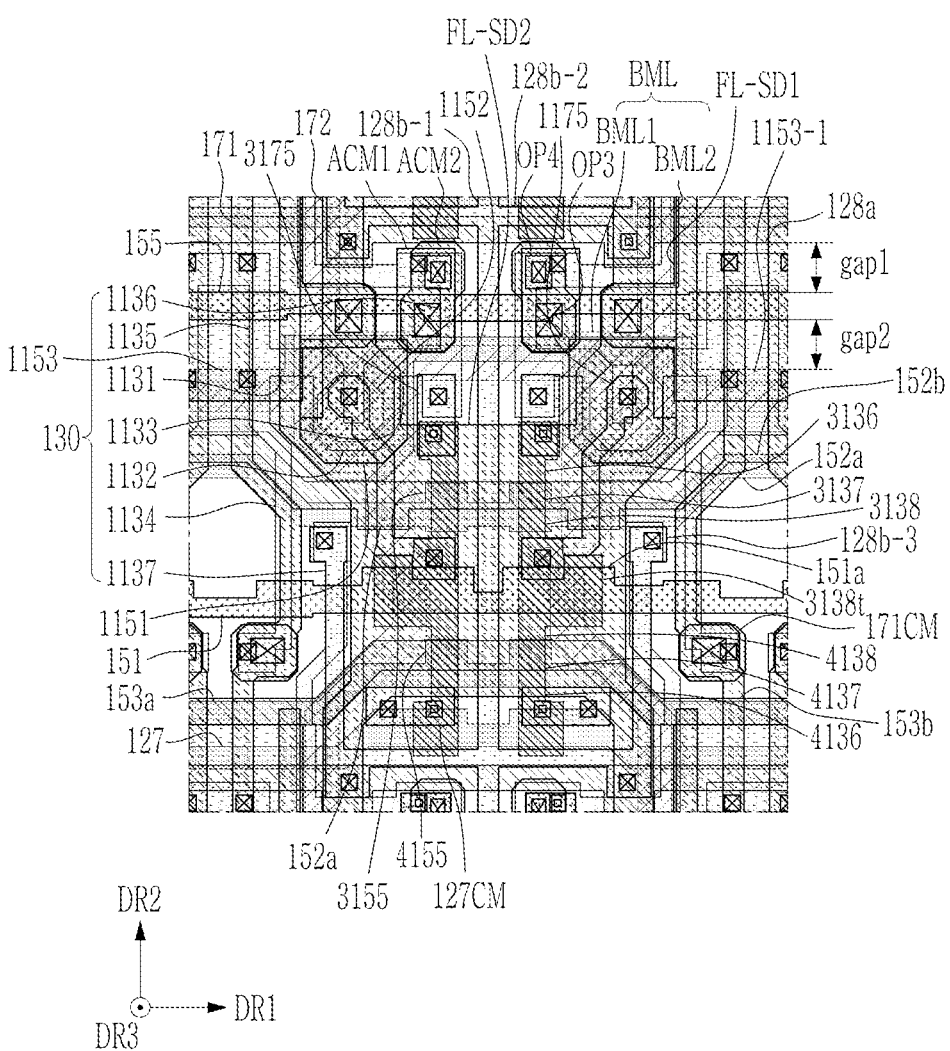

Referring to FIG. 16, FIG. 17, and FIG. 20, the first organic layer 181 may include a lower organic layer opening OP3. A second data conductive layer SD2 including a data line 171, a driving voltage line 172, and an anode connecting electrode ACM2 may be positioned on the first organic layer 181. The second organic layer 182 and the third organic layer 183 may be positioned on the second data conductive layer SD2, and the anode connection opening OP4 may be formed in the second organic layer 182 and the third organic layer 183. The anode connecting electrode ACM2 may be connected (e.g., electrically connected) to the anode ANODE through the anode connection opening OP4. FIG. 16 is a schematic top plan view only showing the second data conductive layer SD2 and the openings OP3 and OP4 as it is difficult to readily recognize the second data conductive layer SD2 in FIG. 17. FIG. 17 is a schematic top plan view showing the second data conductive layer SD2 and all surrounding layers.

Referring to FIG. 16 and FIG. 17, the lower organic layer opening OP3 may overlap the connection part 171CM, the anode connecting electrode ACM1, and the expansion part FL-SD1 positioned in the first data conductive layer SD1 and may expose the connection part 171CM, the anode connecting electrode ACM1, and the expansion part FL-SD1, respectively.

The second data conductive layer SD2 may include a data line 171, a driving voltage line 172, and an anode connecting electrode ACM2.

The data line 171 and the driving voltage line 172 may substantially extend in the vertical direction (e.g., the second direction). The data line 171 may be connected (e.g., electrically connected) to the connection part 171CM of the first data conductive layer SD1 through the lower organic layer opening OP3 and may be connected (e.g., electrically connected) to the second transistor T2 through the lower organic layer opening OP3. The driving voltage line 172 may be connected (e.g., electrically connected) to the fifth transistor T5 and the first storage electrode 1153 through the expansion part FL-SD1 of the first data conductive layer SD1 through the lower organic layer opening OP3. The anode connecting electrode ACM2 may be connected (e.g., electrically connected) to the anode connecting electrode ACM1 of the first data conductive layer SD1 through the opening OP3 and may be connected (e.g., electrically connected) to the sixth transistor T6.

Referring to FIG. 16, the driving voltage line 172 may further include an expansion part FL-SD2 (hereinafter referred to as a second extension) and a protruded wiring part 172-e, and may have a structure that is not formed at the portion where the anode connecting electrode ACM2 is formed.

The expansion part FL-SD2 may be formed wide in order to planarize the anode ANODE. The expansion part FL-SD2 of the second data conductive layer SD2 may overlap the anode ANODE of the green light emitting diode LED in a plan view, so it may be called an anode planarizing extension part for the green light emitting diode LED.

For example, the protruded wiring part 172-e of the driving voltage line 172 may be formed as two on sides (e.g., opposite sides) of two data lines 171 in order to flatly form the anode ANODE, thereby having a structure of a total of four wires 171 and 172-e positioned below the anode.

Referring to the embodiment of FIG. 17, the portions having two intervals (or two distances) gap1 and gap2 that are constant may overlap four wiring structures 171 and 172-e of the second data conductive layer SD2 in a plan view. For example, the portion in which two intervals (or two distances) gap1 and gap2 are constant and four wiring structures 171 and 172-e may overlap the anode ANODE of the red or blue light emitting diode (LED) and/or the openings OPr and OPb of the pixel definition layer 380 in a plan view.

Due to the structure under the anode ANODE and the organic layers 181, 182, and 183 as described above, the anode ANODE may have a planarization characteristic. Thus, the display quality may be improved or enhanced by preventing the light reflected from the anode ANODE from spreading asymmetrically, and by reducing the reflected color band due to a color spread (e.g., a color separation) caused by the reflected light as a result.

For example, the anode ANODE of the green light emitting diode (LED) overlapping the expansion part FL-SD2 positioned in the second data conductive layer SD2 may have the improved flattening characteristic rather than the anode ANODE of the red or blue light emitting diode (LED) overlapping the expansion part FL-SD1 positioned in the first data conductive layer SD1.

Referring to FIG. 20, as the color filter layer 230 is positioned on the light emitting diode (LED), the green color filter may be positioned on the green light emitting diode (LED). In case that the external light is incident on the anode ANODE of the green light emitting diode (LED), it is changed to the green light with passing through the green color filter, and in case that it is reflected from the anode ANODE of the green light emitting diode (LED) and emitted to the outside, the green light may be displayed. For example, as the anode ANODE of the green light emitting diode (LED) is flatter than the anode ANODE of the light emitting diode (LED) of another color, the green light may not have the asymmetric reflection, so the user may not recognize the green reflective color band that is caused by the asymmetric reflection. As a result, deterioration of display quality due to reflection of external light may be removed.

In an embodiment, the expansion part FL-SD1 and the expansion part FL-SD2 may be connected (e.g., electrically connected) to the driving voltage line 172 to transmit the driving voltage ELVDD.

The second data conductive layer SD2 may include a metal or a metal alloy such as aluminum (Al), copper (Cu), molybdenum (Mo), or titanium (Ti), and may be formed as a single layer or multiple layers.

Referring to FIG. 20, a second organic layer 182 and a third organic layer 183 may be positioned on the second data conductive layer SD2. The second organic layer 182 and the third organic layer 183 may be an organic insulator, and may include at least one material selected from the group of polyimide, polyamide, acryl resin, benzocyclobutene, and phenol resin. In another example, the third organic layer 183 may be omitted.

The second organic layer 182 and the third organic layer 183 may include an anode connection opening OP4, and the anode ANODE and the anode connecting electrode ACM2 may be connected (e.g., electrically connected) by this.

For the first organic layer 181, the second organic layer 182, and the third organic layer 183 to form the anode ANODE positioned thereon to be flatter, an exposure and development process to flatten the top surface of each organic layer using a slit mask after stacking each organic layer may be applied. A process by using such a slit mask may be performed every time in case that each organic layer is stacked, and some organic layers may not be exposed to a slit mask even after stacking. For example, as the slit mark used at this time has a slit pattern parallel in the first direction DR1, e.g., in the horizontal direction, the step difference in the organic layer caused by the pattern in the vertical direction (e.g., a second direction DR2) formed on the first data conductive layer SD1 and/or the second data conductive layer SD2 may be more readily removed.

Figure 18:
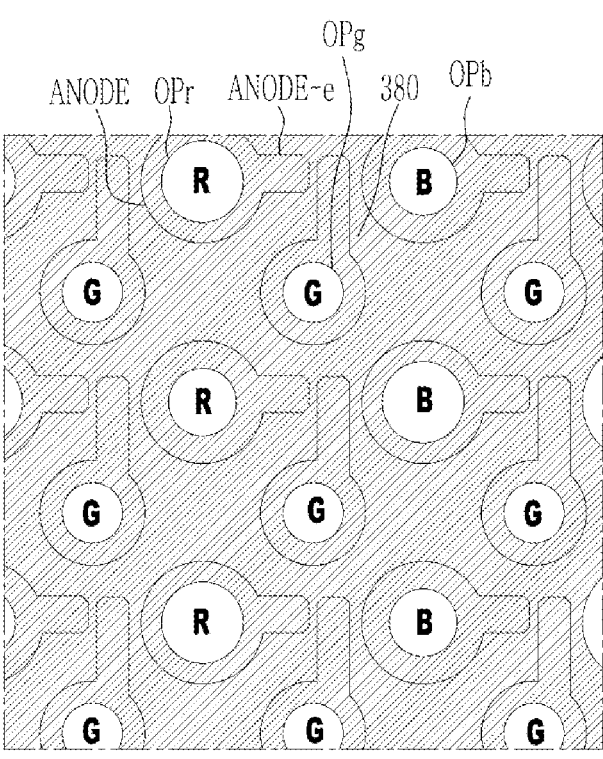
Figure 19:
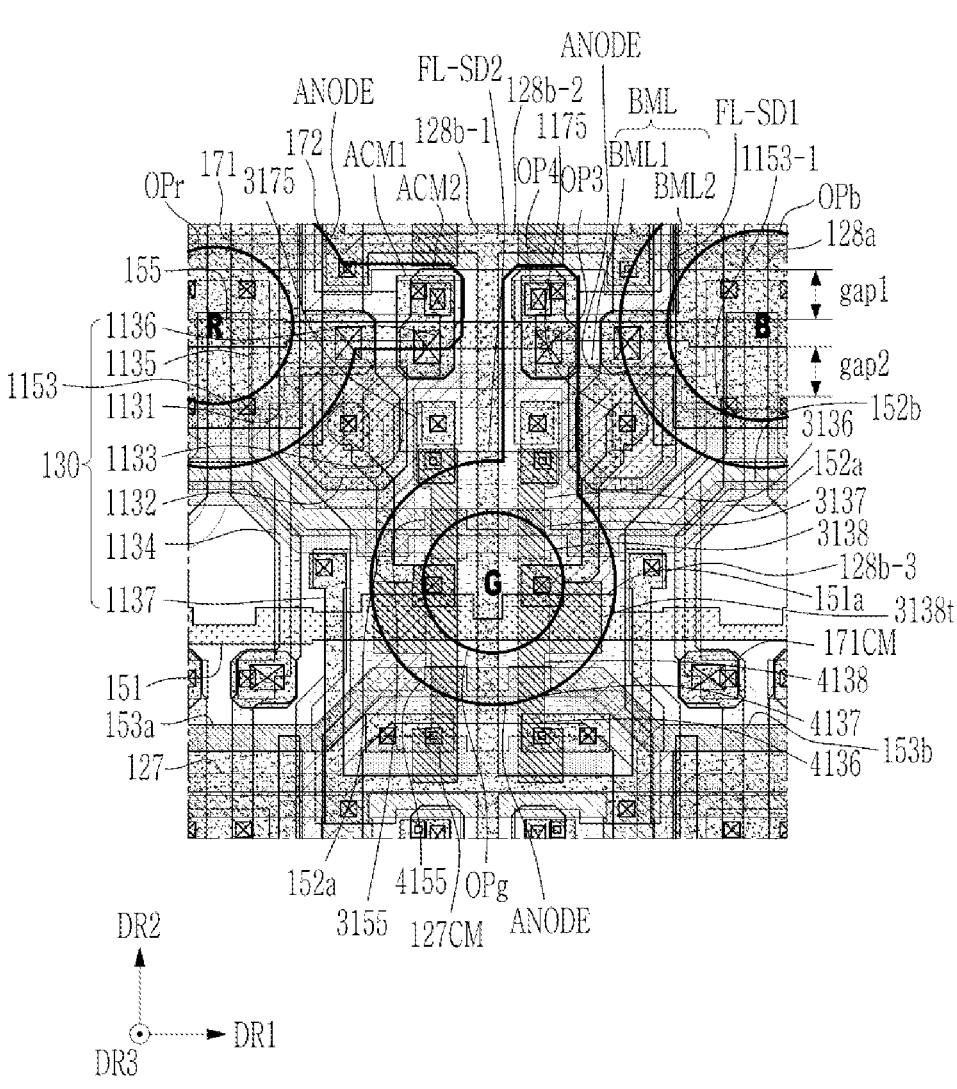

Referring to FIG. 18 and FIG. 19, the anode ANODE may be formed on the third organic layer 183. The anode ANODE may further include an extension ANODE-e to receive a current from the pixel circuit part through the anode connection opening OP4.

Referring to FIG. 18 and FIG. 20, the pixel definition layer 380 may be positioned on the anode ANODE, and the openings OPr, OPg and OPb of the pixel definition layer 380 may be formed to overlap the anode ANODE.

The openings OPr, OPg, and OPb formed in the pixel definition layer 380 may be divided into a red opening OPr overlapping the anode ANODE of the red light emitting diode (LED), a green opening OPg overlapping the anode ANODE of the green light emitting diode (LED), and a blue opening OPb overlapping the anode ANODE of the blue light emitting diode (LED). The extension ANODE-e of the anode ANODE may not be exposed by the openings OPr, OPg, and OPb of the pixel definition layer 380, and may have a structure overlapping the pixel definition layer 380 in a plan view. As a result, the anode connection opening OP4 may have a structure overlapping the pixel definition layer 380 on the plane. According to an embodiment, the pixel definition layer 380 may have an opaque characteristic. For example, the pixel definition layer 380 may include a black color pigment.

A planar structure in which the above structures are stacked is shown in FIG. 19.

Referring to FIG. 19, as the anode connection opening OP4 does not overlap the openings OPr, OPg, and OPb of the pixel definition layer 380 and the opening OPBM of the light blocking layer 220 in a plan view, it may have the structure overlapping the pixel definition layer 380 and the light blocking layer 220 in a plan view.

For example, some of the lower organic layer opening OP3 (e.g., the first lower organic layer opening) at least partially planarly may overlap the opening OPBM of the light blocking layer 220, and the remaining lower organic layer opening OP3, e.g., the second lower organic layer opening may overlap the light blocking layer 220 in a plan view. For example, all (or some) of lower organic layer openings OP3 may overlap the pixel definition layer 380 in a plan view.

For example, in an embodiment, the expansion part FL-SD1 of the first data conductive layer SD1 positioned under the anode ANODE and the expansion part FL-SD2 of the second data conductive layer SD2, the portion exposed through the openings OPr, OPg, and OPb of the pixel definition layer 380 at least among the anode ANODE may be formed to be flat.

For example, the anode ANODE of the green light emitting diode (LED) overlapping the expansion part FL-SD2 positioned in the second data conductive layer SD2 may have the improved flattening characteristic compared to the anode ANODE of the red or blue light emitting diode (LED) overlapping the expansion part FL-SD1 positioned in the first data conductive layer SD1. As a result, the green light that passes through the green color filter among the external light may not have the asymmetric reflection, so that the user cannot recognize the green reflective color band. As a result, the deterioration of the display quality due to the reflection of the external light may be removed.

This is described in detail with reference to FIG. 21.

For example, referring to the embodiment of FIG. 19, the portion where two intervals (or two distances) gap1 and gap2 are constant may overlap the anode ANODE of the red or blue light emitting diode (LED) and/or the openings OPr, OPg, and OPb of the pixel definition layer 380 in a plan view. For example, the centers of the openings OPr, OPg, and OPb of the pixel definition layer 380 may be positioned on the light emitting control line 155 that is the center portion of two intervals (or two distances) gap1 and gap2 in a plan view. For example, the upper boundary among the openings OPr, OPg, and OPb of the pixel definition layer 380 may overlap the second initialization voltage line 128a in a plan view, and the lower boundary among the openings OPr, OPg, and OPb of the pixel definition layer 380 may overlap the first storage electrode 1153 in a plan view. As above-described by the structure under the anode ANODE and the organic layer 181, 182, and 183, as the anode ANODE has the flattening characteristic, the anode ANODE may prevent the light reflected from the anode ANODE from spreading asymmetrically. As a result, the display quality may be improved or enhanced by reducing the reflected color band due to the color spread (e.g., the color separation) phenomenon caused by the reflected light. This is described in detail through FIG. 22.

Based on the planar structure as described above, the entire cross-section structure of the light emitting display device is described with reference to FIG. 20.

FIG. 20 is a schematic cross-sectional view of a light emitting display device according to an embodiment.

FIG. 20 shows the stacked structure of the first component area EA1 in addition to the stacked structure of the display area DA.

The light emitting display device may be largely divided into a lower panel layer LOW-PL and an upper panel layer UP-PL, and the lower panel layer LOW-PL may be the part where the light emitting diode LED and the pixel circuit part forming the pixel are positioned, and may include the encapsulation layer 400 covering them. For example, the pixel circuit part may include the second organic layer 182 and the third organic layer 183, and may mean the configuration below them, and the light emitting diode LED mean configurations positioned above the third organic layer 183 and located below the encapsulation layer 400. A structure positioned above the encapsulation layer 400 may correspond to the upper panel layer UP-PL. In another example, the third organic layer 183 may not be included.

Referring to FIG. 20, a metal layer BML may be positioned on a substrate 110.

The substrate 110 may include a material that does not bend due to a rigid characteristic such as glass, or a flexible material, which is bendable, such as plastic or polyimide. In the case of the flexible substrate, as shown in FIG. 20, the substrate 110 may have a structure in which a double-layered structure of polyimide and a barrier layer formed of an inorganic insulating material thereon is formed double.

The metal layer BML may be formed at a position overlapping the channel of the driving transistor T1 in a plan view among the subsequent first semiconductor layer and is referred to as a lower shielding layer. The metal layer BML may include a metal such as copper (Cu), molybdenum (Mo), aluminum (Al), titanium (Ti), or a metal alloy.

A buffer layer 111 may be positioned on the substrate 110 and the metal layer BML. The buffer layer 111 may function to block the penetration of impurity elements into a first semiconductor layer ACT_P-Si, and may be an inorganic insulating layer including a silicon oxide ($SiO_x$), a silicon nitride ($SiN_x$), a silicon oxynitride ($SiO_xN_y$), etc.

The first semiconductor layer ACT_P-Si formed of a silicon semiconductor (e.g., a polycrystalline semiconductor (P—Si)) may be positioned on the buffer layer 111. The first semiconductor layer 130 may include a channel of a polycrystalline transistor LTPS_TFT including the driving transistor T1 and a first area and a second area positioned on sides (e.g., opposite sides) thereof. For example, the polycrystalline transistor LTPS_TFT may include not only the driving transistor T1 but also a second transistor T2, a fifth transistor T5, a sixth transistor T6, and a seventh transistor T7. For example, sides (e.g., opposite sides) of the channel of the first semiconductor layer ACT_P-Si have a region having a conductive layer characteristic by a plasma treatment or doping, so that the sides of the channel may function as a first electrode and a second electrode of the transistor.

The first gate insulating layer 141 may be positioned on the first semiconductor layer ACT_P-Si. The first gate insulating layer 141 may be an inorganic insulating layer including a silicon oxide ($SiO_x$), a silicon nitride ($SiN_x$), a silicon oxynitride ($SiO_xN_y$), or the like.

A first gate conductive layer GAT1 including a gate electrode of the polycrystalline transistor LTPS_TFT may be positioned on the first gate insulating layer 141. In the first gate conductive layer GAT1, a first scan line or a light emitting control line may be formed in addition to the gate electrode of the polycrystalline transistor LTPS_TFT. The first gate conductive layer GAT1 may include a metal such as copper (Cu), molybdenum (Mo), aluminum (Al), or titanium (Ti), or a metal alloy, and may be formed as a single layer or multiple layers.

After forming the first gate conductive layer GAT1, a plasma treatment or a doping process may be performed to make the exposed region of the first semiconductor layer conductive. For example, the first semiconductor layer ACT_P-Si covered by the first gate conductive layer GAT1 may not be conductive, and the portion of the first semiconductor layer ACT_P-Si not covered by the first gate conductive layer GAT1 may have the same characteristic as the conductive layer.

A second gate insulating layer 142 may be positioned on the first gate conductive layer GAT1 and the first gate insulating layer 141. The second gate insulating layer 142 may be an inorganic insulating layer including a silicon oxide ($SiO_x$), a silicon nitride ($SiN_x$), a silicon oxynitride ($SiO_xN_y$), or the like.

A second gate conductive layer GAT2 including one electrode GAT2_Cst of the storage capacitor Cst and the lower shielding layer GAT2_BML of the oxide transistor Oxide_TFT may be positioned on the second gate insulating layer 142. The lower shielding layer GAT2_BML of the oxide transistor Oxide_TFT may be positioned below the channel of the oxide transistor Oxide_TFT, respectively, thereby functioning to shield from optical or electromagnetic interference provided to the channel from the lower side. For example, one electrode GAT2_Cst of the storage capacitor Cst may overlap the gate electrode 1151 of the driving transistor T1 to form a storage capacitor Cst. According to an embodiment, the second gate conductive layer GAT2 may further include a scan line, a control line, or a voltage line. The second gate conductive layer GAT2 may include a metal or a metal alloy such as copper (Cu), molybdenum (Mo), aluminum (Al), or titanium (Ti), and may be formed as a single layer or multiple layers.

A first interlayer insulating layer 161 may be positioned on the second gate conductive layer GAT2. The first interlayer insulating layer 161 may include an inorganic insulating layer including a silicon oxide ($SiO_x$), a silicon nitride ($SiN_x$), a silicon oxynitride ($SiO_xN_y$), and the like, and an inorganic insulating material may be thickly formed according to an embodiment.

An oxide semiconductor layer ACT2_IGZO including the channel, the first area, and the second area of the oxide transistor Oxide_TFT may be positioned on the first interlayer insulating layer 161.

A third gate insulating layer 143 may be positioned on the oxide semiconductor layer ACT2_IGZO. The third gate insulating layer 143 may be positioned on the surface (e.g., the entire surface) on the oxide semiconductor layer ACT2_IGZO and the first interlayer insulating layer 161. The third gate insulating layer 143 may include an inorganic insulating layer including a silicon oxide (SiO$_x$), a silicon nitride (SiN$_x$), a silicon oxynitride (SiO$_x$N$_y$), or the like.

A third gate conductive layer GAT3 including the gate electrode of the oxide transistor Oxide_TFT may be positioned on the third gate insulating layer 143. The gate electrode of the oxide transistor Oxide_TFT may overlap the channel. The third gate conductive layer GAT3 may further include a scan line or a control line. The third gate conductive layer GAT3 may include a metal or a metal alloy such as copper (Cu), molybdenum (Mo), aluminum (Al), or titanium (Ti), and may be formed as a single layer or multiple layers.

A second interlayer insulating layer 162 may be positioned on the third gate conductive layer GAT3. The second interlayer insulating layer 162 may have a single-layered structure or a multi-layered structure. The second interlayer insulating layer 162 may include an inorganic insulating material such as a silicon nitride (SiN$_x$), a silicon oxide (SiO$_x$), or a silicon oxide (SiO$_x$N$_y$), and may include an organic material according to an embodiment.

A first data conductive layer SD1 including a connecting electrode, which is be connected (e.g., electrically connected) to the first area and the second area of each of the polycrystalline transistor LTPS_TFT and the oxide transistor Oxide_TFT, may be positioned on the second interlayer insulating layer 162. The first data conductive layer SD1 may include a metal such as aluminum (Al), copper (Cu), molybdenum (Mo), titanium (Ti), or a metal alloy, and may be formed as a single layer or multiple layers.

A first organic layer 181 may be positioned on the first data conductive layer SD1. The first organic layer 181 may be an organic insulator including an organic material, and the organic material may include at least one material selected from a group of polyimide, polyamide, acryl resin, benzocyclobutene, and phenol resin.

A second data conductive layer SD2 including an anode connecting electrode ACM2 may be positioned on the first organic layer 181. The second data conductive layer SD2 may include a data line or a driving voltage line. The second data conductive layer SD2 may include a metal or a metal alloy such as aluminum (Al), copper (Cu), molybdenum (Mo), or titanium (Ti), and may be formed as a single layer or multiple layers.

A second organic layer 182 and a third organic layer 183 may be positioned on the second data conductive layer SD2, and an anode connection opening OP4 may be formed in the second organic layer 182 and the third organic layer 183. The anode connecting electrode ACM2 may be connected (e.g., electrically connected) to the anode ANODE through the anode connection opening OP4. The second organic layer 182 and the third organic layer 183 may be organic insulators, and may include at least one material selected from the group of polyimide, polyamide, acryl resin, benzocyclobutene, and phenol resin. In another example, the third organic layer 183 may be omitted.

The pixel definition layer 380 covering at least a part of the anode ANODE and having an opening OP exposing the anode ANODE may be positioned on the anode ANODE. The pixel definition layer 380 may be a black pixel definition layer formed of an organic material with a black color so that light applied from the outside may not be reflected back to the outside, and according to an embodiment, the pixel definition layer 380 may be formed of a transparent organic material. According to an embodiment, the black pixel definition layer 380 may include an organic material of a negative-type black color, and may include a black color pigment.

A spacer 385 may be positioned on the pixel definition layer 380. Unlike the pixel definition layer 380, the spacer 385 may be formed of a transparent organic insulating material. According to an embodiment, the spacer 385 may be formed of a positive-type transparent organic material.

A functional layer FL and a cathode CATHODE may be sequentially formed on the anode ANODE, the spacer 385, and the pixel definition layer 380. In the display area DA and the first component area EA1, the functional layer FL and the cathode CATHODE may be positioned over the entire area. The emission layer EML may be positioned between the functional layers FL. The emission layer EML may be positioned only within the opening OP of the pixel definition layer 380. Hereinafter, a combination of the functional layer FL and the emission layer EML may be referred to as an intermediate layer. The functional layer FL may include at least one of an auxiliary layer such as an electron injection layer, an electron transport layer, a hole transport layer, and a hole injection layer, the hole injection layer and the hole transport layer may be positioned under the emission layer EML, and the electron transport layer and the electron injection layer may be positioned on the emission layer EML.

An encapsulation layer 400 may be positioned on the cathode CATHODE. The encapsulation layer 400 may include at least one inorganic layer and at least one organic layer, and according to an embodiment, may have a triple-layer structure including a first inorganic encapsulation layer, an organic encapsulation layer, and a second inorganic encapsulation layer. The encapsulation layer 400 may be for protecting the emission layer EML from moisture or oxygen that is inflowed from the outside. According to an embodiment, the encapsulation layer 400 may include a structure in which an inorganic layer and an organic layer are sequentially further stacked.

Sensing insulating layers 501, 510, and 511 and sensing electrodes 540 and 541 may be positioned on the encapsulation layer 400 for touch sensing. In an embodiment of FIG. 20, the touch may be sensed in a capacitive type using two sensing electrodes 540 and 541.

For example, the first sensing insulating layer 501 may be formed on the encapsulation layer 400, and sensing electrodes 540 and 541 may be formed on the first sensing insulating layer 501. Sensing sensing electrodes 540 and 541 may be insulated via the second sensing insulating layer 510 interposed therebetween, and some portions of the sensing sensing electrodes 540 and 541 may be connected (e.g., electrically connected) to each other through the opening positioned on the sensing insulating layer 510. For example, the sensing electrodes 540 and 541 include a metal or metal alloy such as aluminum (Al), copper (Cu), silver (Ag), gold (Au), molybdenum (Mo), titanium (Ti), tantalum (Ta), etc., and may be composed of a single layer or multiple layers. The third sensing insulating layer 511 may be formed on the sensing electrode 540.

The light blocking layer 220 and the color filter layer 230 may be positioned on the sensing electrode 540 and the third sensing insulating layer 511.

The light blocking layer 220 may be positioned so as to overlap the sensing electrodes 540 and 541 in a plan view and positioned so as to not overlap the anode in a plan view. This is to prevent the anode ANODE capable of displaying the image from being covered by the light blocking layer 220 and the sensing electrodes 540 and 541.

The color filter layer 230 may be positioned on the third sensing insulating layer 511 and the light blocking layer 220. The color filter layer 230 may include a red color filter that transmits red light, a green color filter that transmits green light, and a blue color filter that transmits blue light. Each color filter layer 230 may be positioned so as to overlap the anode ANODE of the light emitting diode LED in a plan view. The light emitted from the emission layer EML may be emitted with passing through the color filter and being changed into the corresponding color.

The light blocking layer 220 may be positioned between the color filter layers 230, respectively. According to an embodiment, the color filter layer 230 may be replaced with a color conversion layer, or may further include a color conversion layer. The color conversion layer may include quantum dots. For example, according to an embodiment, a reflection adjustment layer filling the opening OPBM of the light blocking layer 220 may be positioned instead of the color filter layer 230. The reflection adjustment layer may have a structure covering the light blocking layer 220, and this is described with reference to FIG. 28.

A planarization layer 550 covering the color filter layer 230 may be positioned on the color filter layer 230. In an embodiment, a polarizer may not be attached on the planarization layer 550. For example, the polarizer may be attached to prevent external light from being reflected. In an embodiment, the opening OPBM of the light blocking layer 220 may be formed in a specific structure to reduce the problem of a reflection color band in which the external light is asymmetrically reflected. Thus, the polarizer may be omitted.

For example, FIG. 20 shows the cross-sectional structure of the first component area EA1.

The first component area EA1 may be a region in which the photosensor area is positioned on the lower panel layer LOW-PL, and may mean a region in which the pixel definition layer 380, the light blocking layer 220, and the color filter layer 230 are not formed.

The first component area EA1 may include only of a transparent layer to transmit light to pass through, and may not include conductive layer or semiconductor layer positioned, and the pixel definition layer 380, the light blocking layer 220, and the color filter layer 230 may have an opening (hereinafter referred to as an additional opening) formed at the position corresponding to the photosensor area, thereby having a structure that does not block light.

For example, the stacked structure of the first component area EA1 according to an embodiment is described based on FIG. 20 as follows.

A buffer layer 111, which is an inorganic insulating layer, may be positioned on the substrate 110, and a first gate insulating layer 141 and a second gate insulating layer 142, which are inorganic insulating layers, may be sequentially positioned thereon. For example, the first interlayer insulating layer 161, the third gate insulating layer 143, and the second interlayer insulating layer 162, which are inorganic insulating layers, may be sequentially stacked on the second gate insulating layer 142. Among the organic insulators, only the first organic layer 181 may be stacked on the second interlayer insulating layer 162. For example, according to an embodiment, the second organic layer 182 and/or the third organic layer 183 may be stacked on the first organic layer 181. According to an embodiment, only one or two organic layers may be formed among the organic insulators of the first organic layer 181, the second organic layer 182, and the third organic layer 183. The functional layer FL may be positioned on the third organic layer 183, and the cathode CATHODE may be positioned on the functional layer FL. The stacked structure from the substrate 110 to the cathode CATHODE so far may correspond to the photosensor area.

The encapsulation layer 400 may be positioned on the cathode CATHODE, and the sensing insulating layers 501, 510, and 511 may be sequentially positioned thereon. The encapsulation layer 400 may have a triple layer structure including a first inorganic encapsulation layer, an organic encapsulation layer, and a second inorganic encapsulation layer. For example, the sensing insulating layers 501, 510, and 511 may be inorganic insulating layers.

The additional opening of the light blocking layer 220 and the color filter layer 230 may be respectively positioned on the third sensing insulating layer 511, and the light blocking layer 220 and the color filter layer 230 may not be formed on the first component area EA1. For example, as the additional opening is positioned in the pixel definition layer 380, the pixel definition layer 380 may not be formed in the first component area EA1.

The planarization layer 550 may be positioned on the third sensing insulating layer 511 in the first component area EA1.

The metal layer BML, the first semiconductor layer ACT1, the first gate conductive layer GAT1, the second gate conductive layer GAT2, the oxide semiconductor layer ACT2, the third gate conductive layer GAT3, the first data conductive layer SD1, the second data conductive layer SD2, and the anode ANODE may not be positioned in the first component area EA1 and the photosensor area. For example, the emission layer EML and the sensing electrodes 540 and 541 may not be formed.

In the first component area EA1 and the photosensor area, the additional opening may be formed in the pixel definition layer 380, the light blocking layer 220, and the color filter layer 230 so that the pixel definition layer 380, the light blocking layer 220, and the color filter layer 230 may not be formed. For example, the light blocking layer 220 may be positioned in case that there is no problem in sensing and the light blocking layer 220 is positioned on the surface (e.g., the entire surface) as the photosensor that uses a wavelength (e.g., infrared) other than the visible rays.

In the above descriptions, the embodiment in which a total of three organic layers are formed, and the anode connection opening is formed in the second organic layer and the third organic layer, is described. For example, the organic layer may be formed of at least two. For example, the anode connection opening may be positioned in the upper organic layer positioned away from the substrate, and the lower organic layer opening may be positioned in the lower organic layer.

In the above descriptions, the overall structure of the light emitting display device and the pixel was described in detail.

Hereinafter, the anode planarization structure of each light emitting diode (LED) may be described through the first data conductive layer SD1, the second data conductive layer SD2, and the openings OPr, OPg, and OPb of the pixel definition layer 380 with reference to FIG. 21, and the arrangement structure of the first gate conductive layer GAT1, the second gate conductive layer GAT2, and the third gate conductive layer GAT3 for the flatter red or blue light emitting diode (LED) is described in detail though FIG. 22.

Figure 21:
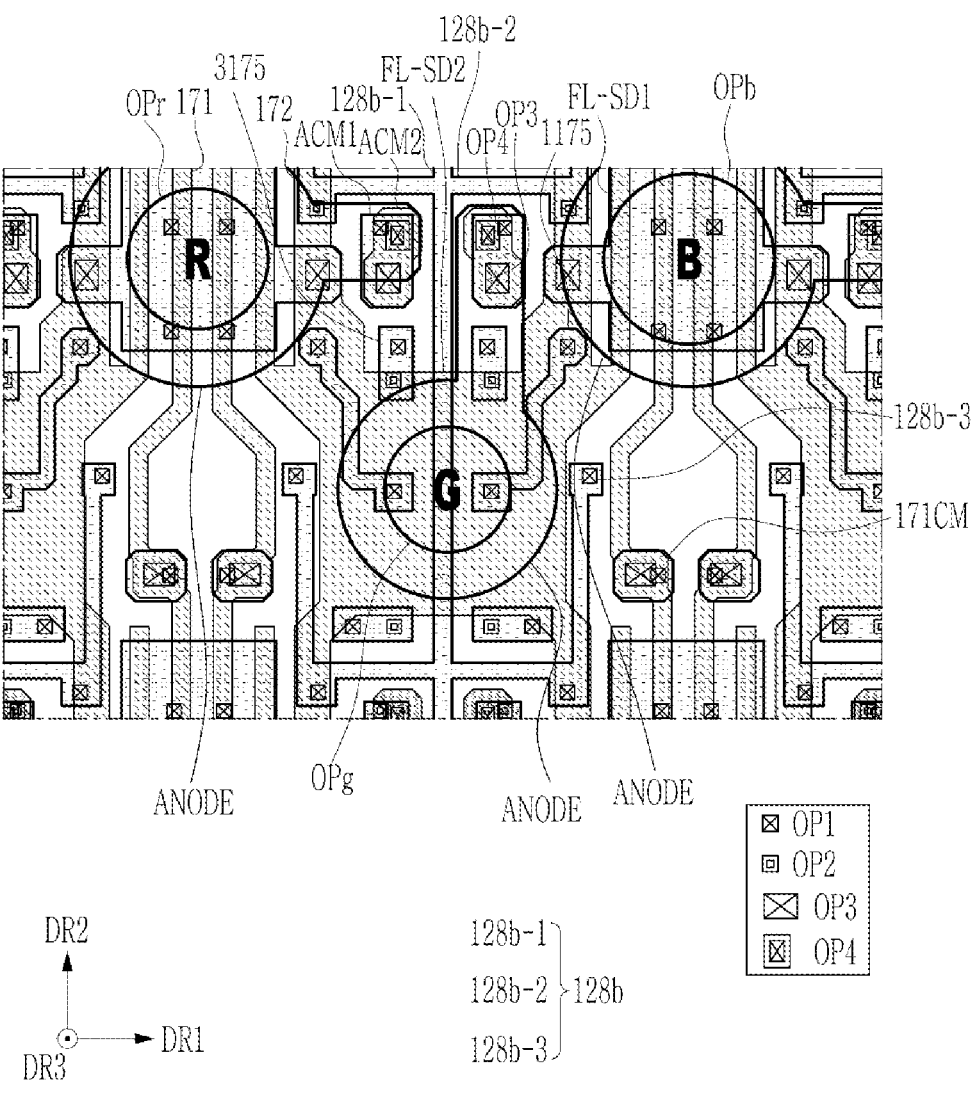
FIG. 21 is a schematic top plan view showing an opening of a pixel definition layer together with a first data conductive layer and a second data conductive layer according to an embodiment.

For example, the relationship of the first data conductive layer SD1, the second data conductive layer SD2, and the openings OPr, OPg, and OPb of the pixel definition layer 380 is described through FIG. 21.

FIG. 21 is a schematic top plan view showing an opening of a pixel definition layer together with a first data conductive layer SD1 and a second data conductive layer SD2 according to an embodiment.

In FIG. 21, the other layers are excluded in order to clearly confirm the relationship between the first data conductive layer SD1, the second data conductive layer SD2, and the opening of the pixel definition layer.

Referring to FIG. 21, the expansion part FL-SD1 positioned in the first data conductive layer SD1 may overlap the red or blue openings OPr and OPb overlapping the anode ANODE for the red or blue light emitting diode (LED) and the anode ANODE for the red or blue light emitting diode (LED) among the opening of the pixel definition layer 380 in a plan view. For example, the expansion part FL-SD2 positioned in the second data conductive layer SD2 may overlap the green opening OPg overlapping the anode ANODE for the green light emitting diode (LED) and the anode ANODE for the green light emitting diode (LED) among the openings of the pixel definition layer 380 in a plan view.

For example, as the pattern (e.g., the data line 171) of the second data conductive layer SD2, the protruded wiring part 172-*e* of the driving voltage line 172 may be positioned between the expansion part FL-SD1 of the first data conductive layer SD1 and the anode ANODE for the red or blue light emitting diode (LED), the flattening characteristic of the anode ANODE for the red or blue light emitting diode (LED) may be relatively low due to the pattern of the second data conductive layer SD2.

For example, as the conductive layer is not positioned between the expansion part FL-SD2 of the second data conductive layer SD2 and the anode ANODE for the green light emitting diode (LED), the flatness may be relatively high. For example, in case that the pixel definition layer 380 includes the black color pigment, the external light may be reflected within the opening of the pixel definition layer 380. Thus, in case that the anode ANODE for the green light emitting diode (LED) of the portion exposed by the green opening OPg is flat, the light may not be reflected asymmetrically because the expansion part FL-SD2 and the green opening OPg of the pixel definition layer 380 overlap each other in a plan view. As a result, there is almost no green light asymmetrically reflected from the external light, so the user may not readily recognize the asymmetry of the external light.

For example, as the protruded wiring part 172-*e* of two driving voltage lines 172 is formed on sides (e.g., opposite sides) of two data lines 171 in the second data conductive layer SD2 and under the anode ANODE for the red or blue light emitting diode (LED), a structure in which a total of four wiring structures 171 and 172-*e* are positioned under the anode ANODE for the red or blue light emitting diode (LED) may be formed. Through this structure, although the flattening characteristic of the anode ANODE for the red or blue light emitting diode (LED) is improved, the flattening characteristic of the anode ANODE for the red or blue light emitting diode (LED) may be lower than that of the anode ANODE for the green light emitting diode (LED).

In an embodiment, in order to further improve the flattening characteristic of the anode ANODE for the red or blue light emitting diode (LED), the interval between the first gate conductive layer GAT1, the second gate conductive layer GAT2, and the third gate conductive layer GAT3 may be constant, and this structure is described through FIG. 22 in detail.

FIG. 22 is a schematic top plan view showing an opening of a pixel definition layer together with a first gate conductive layer GAT1, a second gate conductive layer GAT2, and a third gate conductive layer GAT3 according to an embodiment.

In FIG. 22, only the first gate conductive layer GAT1, the second gate conductive layer GAT2, and the third gate conductive layer GAT3 are shown, and the red opening OPr, the blue opening OPb, and the green opening OPr of the pixel definition layer 380, and the opening OPBM of the light blocking layer 220, which overlap them, are shown for illustrative convenience.

In FIG. 22, to further improve the flattening characteristic of the anode ANODE for the red or blue light emitting diode (LED), the first portion included in the first gate conductive layer GAT1 positioned under the red opening OPr and the blue opening OPb of the pixel definition layer 380, the second portion included in the second gate conductive layer GAT2, and the third portion included in the third gate conductive layer GAT3 may be respectively overlapped, and the interval between the first portion, the second portion, and the third portion may be substantially the same in a plan view. For example, in FIG. 22, an interval (or distance) gap1 and an interval (or distance) gap2 may have the substantially same value.

In the embodiment of FIG. 22, the first portion included in the first gate conductive layer GAT1 may be a light emitting control line 155, the second portion included in the second gate conductive layer GAT2 may be a connection part 1153-1 of a first storage electrode 1153, and the third portion included in the third gate conductive layer GAT3 may be a second initialization voltage line 128*a*.

For example, with respect to the light emitting control line 155 positioned in the first gate conductive layer GAT1, the interval (or distance) gap1 to the lower second initialization voltage line 128*a* positioned in the third gate conductive layer GAT3 and the interval (or distance) gap2 to the connection part 1153-1 of the first storage electrode 1153 positioned in the second gate conductive layer GAT2 may be substantially the same in a plan view. For example, the interval (or distance) gap2 may be the interval (or the distance) from the extension of the light emitting control line 155 to the connection part 1153-1 of the first storage electrode 1153. For example, the interval (or distance) gap2 may be an interval (or distance) up to the connection part 1153-1 of the first storage electrode 1153 from the portion that is not the extension of the light emitting control line 155. By making the interval (or distance) of the first gate conductive layer GAT1, the second gate conductive layer GAT2, and the third gate conductive layer GAT3 positioned below the blue opening OPb of the pixel definition layer 380 constant, the flattening characteristic of the anode ANODE of the blue light emitting diode (LED) positioned thereover may be improved.

For example, referring to FIG. 22, the blue opening OPb having a larger size than the red opening OPr may overlap the first initialization voltage line 127 of the second gate conductive layer GAT2 in a plan view, unlike the red opening OPr. In the embodiment of FIG. 22, the end portion of the blue opening OPb in the second direction DR2 may be positioned on the first initialization voltage line 127, and according to an embodiment, the upper side of the first initialization voltage line 127 and the end portion of the second direction DR2 of the blue opening OPb may coincide in a plan view. As a result, one portion of the second direction DR2 of the blue opening OPb may not be formed lower than the other portion of the blue opening OPb with overlapping the first initialization voltage line 127. Thus, the flattening characteristic of the anode ANODE for the blue light emitting diode (LED) may be further improved.

For example, in the embodiment of FIG. 22, the red opening OPr may not overlap the first initialization voltage line 127 in a plan view, and may overlap the first initialization voltage line 127 according to an embodiment.

For example, in a plan view, the green opening OPg according to the embodiment of FIG. 22 may overlap the lower second scan line 152*a* positioned in the second gate conductive layer GAT2, the upper second scan line 152*b* positioned in the third gate conductive layer GAT3, and the first scan line 151 positioned in the first gate conductive layer GAT1. For example, in a plan view, the green opening OPg may overlap the lower initialization control line 153*a* of the second gate conductive layer GAT2 or the upper initialization control line 153*b* of the third gate conductive layer GAT3. For example, the anode ANODE for the green light emitting diode (LED) corresponding to the green opening OPg may have the sufficient flattening characteristic, so that the interval (or distance) of each portion of the first gate conductive layer GAT1, the second gate conductive layer GAT2, and the third gate conductive layer GAT3 overlapping the green opening OPg in a plan view may not be uniformly disposed.

Figure 23:
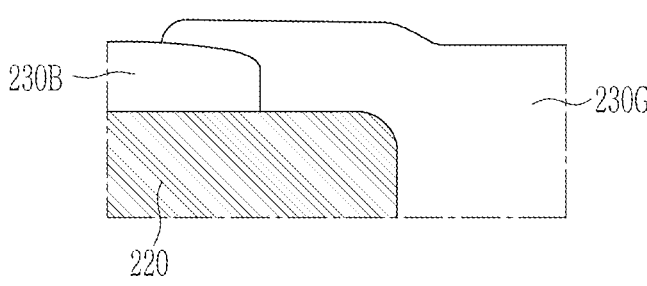
FIG. 23 is a schematic cross-sectional view showing a structure in which adjacent color filter layers of a light emitting display device according to an embodiment overlap on a light blocking layer.
Figure 23:
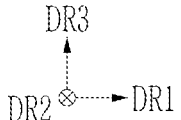

For example, in an embodiment, in order to reduce the asymmetric reflection characteristic of green light, as shown in FIG. 23, the green color filter may have a structure in which it is disposed above the color filters of other colors.

FIG. 23 is a schematic cross-sectional view showing a structure in which adjacent color filter layers of a light emitting display device according to an embodiment overlap on a light blocking layer.

FIG. 23 shows a structure in which the green color filter 230G is positioned upward in the portion where the blue color filter 230B and the green color filter 230G overlap. For example, even in the portion where the red color filter overlaps the green color filter 230G, the green color filter 230G may have a structure positioned thereon. In case that the green color filter 230G is formed above other color filters in this way, in the portion where the color filters overlap, a characteristic in which the external light is incident and reflected may be reduced by about 0.05%, so that the reflection characteristic for the external light may be improved.

The flatness characteristic of the embodiment having these structures is described with reference to FIG. 24 to FIG. 27 with comparing with a comparative example.

FIG. 24 to FIG. 27 are schematic views for comparing and explaining characteristic differences based on a comparative example and an embodiment.

In FIG. 24 to FIG. 27, the flattening characteristic is compared, and in the comparative example, the expansion part FL-SD1 positioned in the first data conductive layer SD1 overlaps the anode ANODE for the green light emitting diode (LED) and the green opening OPg overlap in a plan view, and the expansion part FL-SD2 positioned in the second data conductive layer SD2 overlaps the anode ANODE for the red and blue light emitting diodes (LED) and the red and blue openings OPr and OPb in a plan view. The planar structure of this embodiment and the comparative example is shown in FIG. 24.

The term "flatness" of FIG. 24 indicates a degree of the flatness of the anode as a numerical value, and the larger the numerical value, the greater the step difference.

Referring to the flatness of FIG. 24, the flatness value of the anode ANODE for the green light emitting diode (LED)

in the embodiment may be a significantly reduced value compared to the comparative example, as a result, the asymmetric reflection of the external light may be remarkably reduced, and accordingly, the asymmetric reflection of green light may be very small.

For example, the flatness of the anode ANODE for the red or blue light emitting diode (LED) may be flatter in the comparative example. For example, as the user's eyes are less sensitive than to green light, the asymmetric reflection of the external light may not be well recognized by the user, so the display quality may not deteriorate.

In FIG. 24, reflection color band graphs and numerical values are shown. For example, the larger the value of the reflective color band, the larger the asymmetric reflective color band occurs.

Referring to the reflective color band graph and the value of FIG. 24, in the comparative example, the value of the reflective color band is high and a lot of green light may be reflected. For example, in an embodiment, the reflective color band may be relatively small, and the green light component may be greatly reduced.

Figure 25:
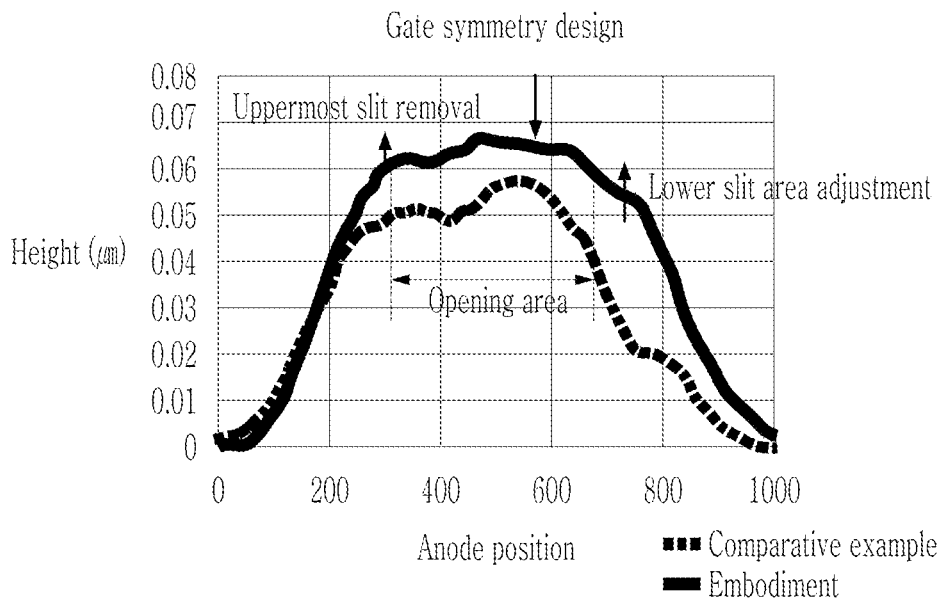

For example, in FIG. 25, based on the anode ANODE for the light emitting diode (LED), a height depending on a position is shown as a graph.

Referring to FIG. 25, the anode ANODE for the light emitting diode (LED) of the embodiment may have a constant height, so that the step difference may be small. However, the anode ANODE for the light emitting diode (LED) of the comparative example has a high possibility of the asymmetrical reflection occurrence due to the high variation depending on the position thereof, and the high relative step difference. In FIG. 25, in the embodiment, the step difference of the portion corresponding to the opening area may be small, so that the asymmetric reflectivity occurs less in the embodiment.

For example, in FIG. 25, the reason why the step difference of the anode ANODE of the embodiment is reduced is additionally shown.

In an embodiment, a process of additional flattening the topmost part among the organic layer, e.g., the third organic layer 183, by using a slit mask may not proceed, so that the height may not be lowered, thereby removing the step difference.

For example, in an embodiment, the lower end, e.g., the second organic layer 182 and/or the first organic layer 181, may be exposed by using a slit mask, but may be exposed by using a slit pattern extending in the first direction DR1, e.g., the horizontal direction, thereby removing the step (or the step difference) formed in response to the direction in which the first data conductive layer SD1 and the second data conductive layer SD2 extend (e.g., the second direction DR2). For example, by adjusting the position of the slit pattern extending in the horizontal direction, the step (or the step difference), which is caused by the first gate conductive layer GAT1, the second gate conductive layer GAT2, and the third gate conductive layer GAT3 extending in the first direction, may be removed or minimized.

For example, as shown in FIG. 22, the interval (or distance) of the first gate conductive layer GAT1, the second gate conductive layer GAT2, and the third gate conductive layer GAT3 may be formed to be constant to eliminate the step difference that may occur in the central portion.

As a result, in the anode ANODE according to an embodiment, the step difference may be reduced and the overall asymmetric reflection does not occur.

In FIG. 26, the method for reducing the step (or the step difference) as described in FIG. 25 may be divided for the anode ANODE of light emitting diode (LED) of each color and is shown in a table.

In a comparative example of FIG. 26, the anode ANODE for the green light emitting diode (LED) has a structure in which the interval between the first gate conductive layer GAT1, the second gate conductive layer GAT2, and the third gate conductive layer GAT3 overlapping therewith may not be constant. For example, in an embodiment, the interval (or distance) between the first gate conductive layer GAT1, the second gate conductive layer GAT2, and the third gate conductive layer GAT3 positioned below the anode ANODE for the red or blue light emitting diode (LED) may have a constant structure, so the step difference may be relatively reduced. For example, in an embodiment, the lower end, e.g., the second organic layer 182 and/or the first organic layer 181, may be exposed by using a slit mask, but may be exposed by using a slit pattern extending in the first direction DR1, e.g., the horizontal direction, thereby being formed flatter by removing the step difference due to the conductive layer positioned thereunder.

For example, in the comparative example of FIG. 26, the anode ANODE for the red or blue light emitting diode (LED) has a structure overlapping the expansion part FL-SD2 of the second data conductive layer SD2. For example, in an embodiment, the anode ANODE for the green light emitting diode (LED) may have a structure overlapping the expansion part FL-SD2 of the second data conductive layer SD2. In an embodiment, in order to make the anode ANODE for the green light emitting diode (LED) flatter, the third organic layer 183 may not be etched with a slit mask, so that the step (or the step difference) may not be further generated and the step difference may be reduced.

In FIG. 26, the step difference of the anode ANODE in a comparative example and an embodiment is numerically described. For the anode ANODE for the green light emitting diode (LED), the asymmetrical reflection of green light may be greatly reduced as the step difference is greatly reduced, for the anode ANODE for the red or blue light emitting diode (LED), and although the step (or the step difference) is slightly increased, the step difference may not be changed significantly, so the anode ANODE may have an asymmetrical reflection characteristic of external light similar to the comparative example. Therefore, compared to the comparative example, only the asymmetric reflection of green light may be greatly reduced in an embodiment, so that the display quality may be greatly increased.

FIG. 26 includes photos of the flatness of the comparative example and the embodiment, and the flatness of the embodiment may be significantly increased compared to the comparative example. Referring to the flatness around the green opening OPg of the pixel definition layer 380 corresponding to the anode ANODE of the green light emitting diode (LED), the flatness may be greatly improved in the embodiment because there is little change in gray.

Figure 27:
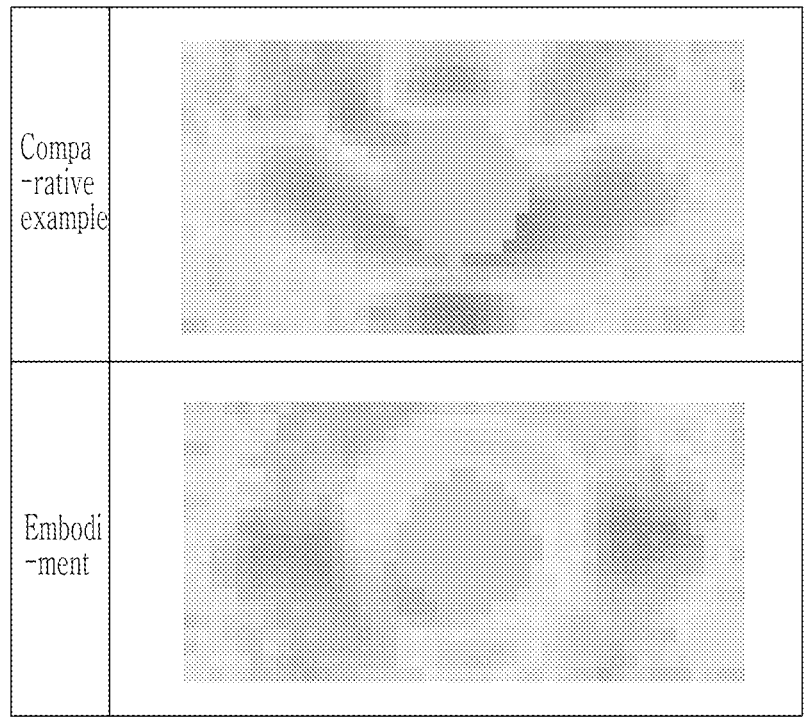

Drawings picturing the reflective color bands that actually occur in the comparative example and the embodiment are shown in FIG. 27.

According to FIG. 27, in the comparative example, the green light may be widely reflected left and right, so that the user may recognize the asymmetrical reflection of the external light, and the asymmetrical reflection may be sensed that the display quality is low.

For example, the reflective color band according to the embodiment of FIG. 27 may be uniformly reflected without any left or right reflected light, and the asymmetrical reflection of green light may be small, thereby it may be difficult for the user to recognize the asymmetrical reflection of external light and the display quality is improved.

Based on the difference in this effect, unlike the comparative example, the expansion part FL-SD2 of the second data conductive layer SD2 may be disposed to overlap the anode ANODE for the green light emitting diode (LED) and the green opening OPg in a plan view, thereby reducing the deterioration of the display quality due to the reflection of the external light perceived by the user by reducing the asymmetric reflection of the green light.

In the above descriptions, as shown in FIG. 20, the embodiment in which the color filter layer 230 is formed in the opening OPBM of the light blocking layer 220 is described. For example, a red color filter, a blue color filter, and a green color filter may be formed in the red opening OPBM, the blue opening OPBM and the green opening OPBM of the light blocking layer 220, respectively. For example, a reflection adjusting layer may be used instead of the color filter layer 230, and hereinafter, the stacked structure of an embodiment in which a reflection adjusting layer 235 is applied instead of the color filter layer 230 is described through FIG. 28.

FIG. 28 is a schematic cross-sectional view of a light emitting display device according to an embodiment.

FIG. 28 is the schematic cross-sectional view corresponding to FIG. 20 below, and hereinafter, the portion that is different from FIG. 20 is described.

A reflection adjustment layer 235 may be disposed on the light blocking layer 220. The reflection adjustment layer 235 may selectively absorb light of a wavelength of some band of light reflected from inside the display device or incident from outside the display device. The reflection adjustment layer 235 may fill the opening OPRM of the light blocking layer 220.

For example, the reflection adjustment layer 235 may absorb the first wavelength band of about 490 nm to about 505 nm and the second wavelength band of about 585 nm to about 600 nm, and the light transmittance in the first wavelength band and the second wavelength band may be provided to be about 40% or less. The reflection adjustment layer 235 may absorb light with a wavelength outside a light emitting wavelength range of red, green, or blue emitted from the light emitting diode LED. As such, the reflection adjustment layer 235 may absorb light of the wavelength that is not included in the wavelength range of red, green, or blue emitted from the light-emitting element. Thus, the decrease in the luminance of the display device may be prevented or minimized, the deterioration of the light emitting efficiency of the display device may be prevented or minimized, and visibility may be improved or enhanced.

In an embodiment, the reflection adjustment layer 235 may be provided as an organic material layer including a dye, a pigment, or a combination thereof. The reflection adjustment layer 235 may include a tetraazaporphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, a cyanine-based compound, and a combination thereof.

In an embodiment, the reflectance measured in Specular Component Included (SCI) mode on the surface of the reflection adjustment layer 235 may be about 10% or less.

For example, the reflection adjustment layer may absorb external light reflection of the display device, so that visibility may be improved.

In an embodiment, the reflection adjustment layer 235 may have transmittance of about 64% to about 72%. The transmittance of the reflection adjustment layer 235 may be adjusted according to the content of the pigment and/or dye included in the reflection adjustment layer 235.

According to an embodiment, the reflection adjustment layer 235 may not be positioned in the first component area EA1.

For example, in the embodiment including the reflection adjustment layer 235, a capping layer AL1 and a low reflection layer AL2 may be additionally formed between the cathode CATHODE and the encapsulation layer 400.

The capping layer AL1 may function to improve the light emitting efficiency of the light-emitting element by a principle of constructive interference. The capping layer AL1 may include a material having a refractive index of 1.6 or more for light having a wavelength of about 589 nm.

The capping layer AL1 may be an organic capping layer including organic materials, an inorganic capping layer including inorganic materials, or a composite capping layer including organic materials and inorganic materials. For example, the capping layer AL1 may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compounds, heterocyclic compounds, and amine group-containing compounds may be optionally substituted with substituents including O, N, S, Se, Si, F, Cl, Br, I, or any combination thereof.

A low reflection layer AL2 may be disposed on the capping layer AL1. The low reflection layer AL2 may overlap the front surface of the substrate 110.

The low reflection layer AL2 may include an inorganic material having low reflectance, e.g., a metal or a metal oxide. In case that the low reflection layer AL2 includes a metal, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof may be included. For example, the low reflection layer AL2 may include the metal oxide, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, or a combination.

In an embodiment, an absorption coefficient (k) of the inorganic material included in the low reflection layer AL2 may be about 4.0 or less and about 0.5 or more ($0.5 \leq k \leq 4.0$). For example, the inorganic material included in the low reflection layer AL2 may have a refractive index (n) of about 1 or more ($n \geq 1.0$).

The low reflection layer AL2 may induce destructive interference between the light incident into the display device and the light reflected from the metal disposed under the low reflection layer AL2, thereby reducing external light reflectivity. Accordingly, the display quality and visibility of the display device may be improved by reducing the reflectance of the external light of the display device through the low reflection layer AL2.

In another example, the capping layer AL1 may be omitted so that the low reflection layer AL2 may be in contact with the cathode CATHODE.

An encapsulation layer 400 may be positioned on the low reflection layer AL2, and the other structures are substantially the same as those of FIG. 20, so a description thereof is omitted for descriptive convenience.

For example, in the first component area EA1, the cathode CATHODE formed in the display area may not be formed, and in the embodiment of FIG. 35, in the first component area EA1, the low adhesive layer WAL may be positioned at the cathode CATHODE position. The low adhesive layer WAL may be positioned on the functional layer FL in the first component area EA1. The low adhesive layer WAL may be a material with weak adherence, and according to an embodiment, the cathode CATHODE may not be disposed on the upper surface of the low adhesive layer WAL, or may include a material having a characteristic in which the cathode CATHODE is formed of a very thin film.

For example, the low adhesive layer WAL may be formed by using a material such as 8-quinolinato lithium (Liq; [8-quinolinolato lithium]), N,N-diphenyl-N,N-bis(9-phenyl-9H-carbazole-3-yl)biphenyl-4,4'-diamine (HT01), N(diphenyl-4-yl)9,9-dimethyl-N-(4(9-phenyl-9H-carbazole-3-yl) phenyl)-9H-fluorene-2-amine (HT211), 2-(4-(9,10-di (naphthalene-2-yl)anthracene-2-yl)phenyl)-1-phenyl-1H-benzo-[D]imidazole (LG201), etc.

This specification shows and describes the embodiment in which the low adhesive layer WAL is positioned in the first component area EA1, but in an embodiment, the low adhesive layer WAL may be removed through a laser process or the like. For example, the laser process may be a laser process performed on the cathode CATHODE.

In the first component area EA1, on the low adhesive layer WAL, the capping layer AL1, the low reflection layer AL2, and the encapsulation layer 400 may be disposed.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A light emitting display device comprising:
   a lower panel layer comprising:
   a first semiconductor layer; a first gate insulating layer; a first gate conductive layer; a second gate insulating layer; a second gate conductive layer; a first interlayer insulating layer; a second semiconductor layer; a third gate insulating layer; a third gate conductive layer; a second interlayer insulating layer; a first data conductive layer; a first organic layer; a second data conductive layer; and a second organic layer, which are sequentially stacked on a substrate;
   a green light emitting diode (LED) anode, a red light emitting diode (LED) anode, and a blue light emitting diode (LED) anode positioned on the second organic layer;
   a pixel definition layer comprising a green opening overlapping the green light emitting diode (LED) anode, a red opening overlapping the red light emitting diode (LED) anode, and a blue opening overlapping the blue light emitting diode (LED) anode;
   a cathode positioned on the green light emitting diode (LED) anode, the red light emitting diode (LED) anode, the blue light emitting diode (LED) anode, and the pixel definition layer; and an encapsulation layer covering the cathode; and an upper panel layer comprising:

a light blocking layer positioned on the encapsulation layer and comprising a green color filter opening, a red color filter opening, and a blue color filter opening;

a green color filter positioned in the green color filter opening;

a red color filter positioned in the red color filter opening; and a blue color filter positioned in the blue color filter opening, wherein the first data conductive layer comprises a first expansion overlapping the red opening or the blue opening of the pixel definition layer, the second data conductive layer comprises a second expansion overlapping the green opening of the pixel definition layer, and the second expansion of the second data conductive layer entirely overlaps the green opening of the pixel definition layer and does not overlap the red opening and the blue opening, in a plan view.

2. The light emitting display device of claim 1, wherein the red opening or the blue opening of the pixel definition layer overlaps a first portion of the first gate conductive layer, a second portion of the second gate conductive layer, and a third portion of the third gate conductive layer, and distances between the first portion of the first gate conductive layer, the second portion of the second gate conductive layer, and the third portion of the third gate conductive layer are substantially same in a plan view.

3. The light emitting display device of claim 2, wherein the second portion of the second gate conductive layer is adjacent to a side of the first portion of the first gate conductive layer, the third portion of the third gate conductive layer is adjacent to another side of the first portion of the first gate conductive layer, and a distance between the first portion of the first gate conductive layer and the second portion of the second gate conductive layer and a distance between the first portion of the first gate conductive layer and the third portion of the third gate conductive layer are substantially same as each other in a plan view.

4. The light emitting display device of claim 3, wherein the first portion of the first gate conductive layer is a light emitting control line, the second portion of the second gate conductive layer is a connection part of a first storage electrode, and the third portion of the third gate conductive layer is a second initialization voltage line.

5. The light emitting display device of claim 4, wherein the lower panel layer further comprises a plurality of pixel circuit parts electrically connected to the green light emitting diode (LED), the red light emitting diode (LED), and the blue light emitting diode (LED), respectively, each of the plurality of pixel circuit parts comprises:

a driving transistor that transmits a current to the green light emitting diode (LED), the red light emitting diode (LED), or the blue light emitting diode (LED);

a fifth transistor that transmits a driving voltage to a first electrode of the driving transistor;

a sixth transistor electrically connected to a second electrode of the driving transistor to transmit a current to the green light emitting diode (LED), the red light emitting diode (LED), or the blue light emitting diode (LED);

a seventh transistor that initializes the red light emitting diode (LED) anode, the blue light emitting diode (LED) anode, or the green light emitting diode (LED) anode; and a storage capacitor that stores a voltage of a gate electrode of the driving transistor, the first storage electrode overlaps the gate electrode of the driving transistor to form the storage capacitor, the light emitting control line is electrically connected to a gate electrode of the fifth transistor and a gate electrode of the sixth transistor, and the second initialization voltage line is electrically connected to the seventh transistor.

6. The light emitting display device of claim 5, wherein each of the plurality of pixel circuit parts further comprises:

a second transistor that transmits a data voltage to the first electrode of the driving transistor;

a third transistor electrically connecting the second electrode of the driving transistor and the gate electrode of the driving transistor; and a fourth transistor that initializes the gate electrode of the driving transistor.

7. The light emitting display device of claim 5, wherein the connection part of the first storage electrode comprises an upper side that is spaced apart from the upper side of the first storage electrode.

8. The light emitting display device of claim 5, wherein the light emitting control line extends in a first direction, and the distance between the first portion of the first gate conductive layer and the second portion of the second gate conductive layer and the distance between the first portion of the first gate conductive layer and the third portion of the third gate conductive layer are distances in a second direction perpendicular to the first direction.

9. The light emitting display device of claim 1, wherein the lower panel layer comprises:

a metal layer and a buffer layer sequentially stacked between the substrate and the first semiconductor layer;

a spacer positioned on the pixel definition layer;

an emission layer positioned in the green opening, the red opening, and the blue opening of the pixel definition layer; and a functional layer positioned between the green light emitting diode (LED) anode, the red light emitting diode (LED) anode, and the blue light emitting diode (LED) anode, and the cathode.

10. The light emitting display device of claim 1, wherein the upper panel layer further comprises:

a plurality of sensing electrodes that sense a touch; and a plurality of sensing insulating layers positioned between the plurality of sensing electrodes.

11. The light emitting display device of claim 1, wherein a polarizer is not attached to an entire surface of the green color filter, the red color filter, and the blue color filter.

12. The light emitting display device of claim 1, wherein the first expansion of the first data conductive layer overlaps the red opening or the blue opening of the pixel definition layer, and the second expansion of the second data conductive layer overlaps the green opening of the pixel definition layer.

13. An electronic device comprising:

a housing comprising a back surface and a side surface;

a cover window disposed above the housing;

a display panel disposed under the cover window and comprising a display area and a component area surrounded by the display area; and an optical sensor disposed in the component area of the display panel, the display panel comprises:

a lower panel layer comprising:

a first semiconductor layer; a first gate insulating layer; a first gate conductive layer; a second gate insulating layer; a second gate conductive layer; a first interlayer insulating layer; a second semiconductor layer; a third gate insulating layer; a third gate conductive layer; a second interlayer insulating layer; a first data conductive layer; a first organic layer; a second data conductive layer; and a second organic layer, which are sequentially stacked on a substrate;

a green light emitting diode (LED) anode, a red light emitting diode (LED) anode, and a blue light emitting diode (LED) anode positioned on the second organic layer;

a pixel definition layer comprising a green opening overlapping the green light emitting diode (LED) anode, a red opening overlapping the red light emitting diode (LED) anode, and a blue opening overlapping the blue light emitting diode (LED) anode;

a cathode positioned on the green light emitting diode (LED) anode, the red light emitting diode (LED) anode, the blue light emitting diode (LED) anode, and the pixel definition layer; and an encapsulation layer covering the cathode; and an upper panel layer comprising:

a light blocking layer positioned on the encapsulation layer and comprising a green color filter opening, a red color filter opening, and a blue color filter opening;

a green color filter positioned in the green color filter opening;

a red color filter positioned in the red color filter opening; and a blue color filter positioned in the blue color filter opening, wherein the first data conductive layer comprises a first expansion overlapping the red opening or the blue opening of the pixel definition layer, the second data conductive layer comprises a second expansion overlapping the green opening of the pixel definition layer, and the second expansion of the second data conductive layer entirely overlaps the green opening of the pixel definition layer and does not overlap the red opening and the blue opening in a plan view.

14. The electronic device of claim 13, wherein the red opening or the blue opening of the pixel definition layer overlaps a first portion of the first gate conductive layer, a second portion of the second gate conductive layer, and a third portion of the third gate conductive layer, and distances between the first portion of the first gate conductive layer, the second portion of the second gate conductive layer, and the third portion of the third gate conductive layer is substantially same in a plan view.

15. The electronic device of claim 14, wherein the second portion of the second gate conductive layer is adjacent to a side of the first portion of the first gate conductive layer, the third portion of the third gate conductive layer is adjacent to another side of the first portion of the first gate conductive layer, and a distance between the first portion of the first gate conductive layer and the second portion of the second gate conductive layer and a distance between the first portion of the first gate conductive layer and the third portion of the third gate conductive layer are substantially same as each other.

16. The electronic device of claim 15, wherein the first portion of the first gate conductive layer is a light emitting control line, the second portion of the second gate conductive layer is a connection part of a first storage electrode, and the third portion of the third gate conductive layer is a second initialization voltage line.

17. The electronic device of claim 16, wherein the lower panel layer further comprises a plurality of pixel circuit parts electrically connected to the green light emitting diode (LED), the red light emitting diode (LED), and the blue light emitting diode (LED), respectively, each of the plurality of pixel circuit parts comprises:

a driving transistor that transmits a current to the green light emitting diode (LED), the red light emitting diode (LED), or the blue light emitting diode (LED);

a fifth transistor that transmits a driving voltage to a first electrode of the driving transistor;

a sixth transistor electrically connected to a second electrode of the driving transistor to transmit a current to the green light emitting diode (LED), the red light emitting diode (LED), or the blue light emitting diode (LED);

a seventh transistor that initializes the red light emitting diode (LED) anode, the blue light emitting diode (LED) anode, or the green light emitting diode (LED) anode; and a storage capacitor that stores a voltage of a gate electrode of the driving transistor, the first storage electrode overlaps the gate electrode of the driving transistor to form the storage capacitor, the light emitting control line is electrically connected to a gate electrode of the fifth transistor and a gate electrode of the sixth transistor, and the second initialization voltage line is electrically connected to the seventh transistor.

18. The electronic device of claim 17, wherein each of the plurality of pixel circuit parts further comprises:

a second transistor that transmits a data voltage to the first electrode of the driving transistor;

a third transistor electrically connecting the second electrode of the driving transistor and the gate electrode of the driving transistor; and a fourth transistor that initializes the gate electrode of the driving transistor.

19. The electronic device of claim 17, wherein the connection part of the first storage electrode has an upper side spaced apart from the upper side of the first storage electrode.

20. The electronic device of claim 17, wherein the light emitting control line extends in a first direction, and the distance between the first portion of the first gate conductive layer and the second portion of the second gate conductive layer and the distance between the first portion of the first gate conductive layer and the third portion of the third gate conductive layer are distances in a second direction perpendicular to the first direction.

* * * * *